(12) United States Patent
Narui

(10) Patent No.: US 7,829,908 B2
(45) Date of Patent: Nov. 9, 2010

(54) SOLID-STATE IMAGE SENSORS AND DISPLAY DEVICES HAVING ANTI-REFLECTION FILM

(75) Inventor: Tadashi Narui, Sagamihara (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 12/084,679

(22) PCT Filed: Nov. 1, 2006

(86) PCT No.: PCT/JP2006/321881

§ 371 (c)(1),
(2), (4) Date: May 5, 2008

(87) PCT Pub. No.: WO2007/055141

PCT Pub. Date: May 18, 2007

(65) Prior Publication Data

US 2009/0045477 A1    Feb. 19, 2009

(30) Foreign Application Priority Data

Nov. 11, 2005    (JP)    ............... 2005-327344

(51) Int. Cl.
H01L 27/15    (2006.01)
(52) U.S. Cl. ........................ 257/98; 257/432
(58) Field of Classification Search .............. 257/432, 257/98
See application file for complete search history.

(56) References Cited

U.S. PATENT DOCUMENTS 7,167,221 B2 *    1/2007    Yeh et al. .................... 349/110

2002/0027239 A1    3/2002    Ohkubo
2005/0122417 A1*    6/2005    Suzuki ....................... 348/340
2005/0287479 A1*    12/2005    Moon .......................... 430/330

FOREIGN PATENT DOCUMENTS

| JP | 10-311903 | 11/1998 |
| JP | 2000-196051 A | 7/2000 |
| JP | 2001-352051 | 12/2001 |
| JP | 2005-252194 | 9/2005 |
| JP | 2006-041542 | 2/2006 |

OTHER PUBLICATIONS

English-language translation of International Preliminary Report on Patentability issued in corresponding international application No. PCT/JP2006/321881.

* cited by examiner

Primary Examiner—Wai-Sing Louie
Assistant Examiner—Bilkis Jahan
(74) Attorney, Agent, or Firm—Klarquist Sparkman, LLP

(57) ABSTRACT

Solid-state image sensors are disclosed that include an optical unit which separates incident light into a plurality of color elements, an optical receiving unit which converts each of the color elements separated by the optical unit to an electrical signal and an anti-reflection film having a high-refractive-index layer with a refractive index of 1.7 or higher and a low-refractive-index layer with a refractive index of less than 1.7. The anti-reflection film is between the optical unit for each of color elements and the optical receiving unit, on a semiconductor substrate. Each of the high-refractive-index layer and the low-refractive-index layer corresponds to at least one color element of the plurality of color elements and includes two or more layers. With such sensors it is possible to suppress the variation in sensitivity for each color.

15 Claims, 18 Drawing Sheets

(a)

Blue pixel

| | | SiN film thickness (nm) | | | | | | | | | | | | |
|---|---|---|---|---|---|---|---|---|---|---|---|---|---|---|
| | | 20 | 30 | 40 | 50 | 60 | 70 | 80 | 90 | 100 | 110 | 120 | 130 | 140 |
| SiO2 film thickness (nm) | 120 | 22.0 | 27.5 | 32.8 | 36.2 | 37.4 | 36.1 | 32.3 | 26.8 | 20.9 | 16.9 | 16.8 | 20.6 | 26.1 |
| | 110 | 18.0 | 22.8 | 28.3 | 32.7 | 35.0 | 34.8 | 32.2 | 27.6 | 21.8 | 16.7 | 14.7 | 16.8 | 21.6 |
| | 100 | 14.1 | 17.5 | 22.6 | 27.5 | 30.8 | 32.0 | 30.7 | 27.1 | 22.0 | 16.6 | 13.1 | 13.1 | 16.5 |
| | 90 | 11.0 | 12.3 | 16.3 | 21.2 | 25.3 | 27.6 | 27.7 | 25.6 | 21.6 | 16.6 | 12.2 | 10.3 | 11.6 |
| | 80 | 9.6 | 8.7 | 10.6 | 14.5 | 18.7 | 21.9 | 23.5 | 23.0 | 20.5 | 16.7 | 12.4 | 9.1 | 8.3 |
| | 70 | 10.2 | 7.7 | 7.2 | 9.0 | 12.3 | 15.8 | 18.5 | 19.6 | 19.0 | 16.8 | 13.4 | 9.9 | 7.4 |
| | 60 | 9.4 | 9.6 | 7.2 | 6.4 | 7.7 | 10.3 | 13.4 | 15.9 | 17.2 | 16.9 | 15.2 | 12.4 | 9.4 |
| | 50 | 16.5 | 13.9 | 10.6 | 7.8 | 6.5 | 7.1 | 9.5 | 12.6 | 15.4 | 17.1 | 17.3 | 16.1 | 13.5 |

(b)

Green pixel

| | | SiN film thickness (nm) | | | | | | | | | | | | |
|---|---|---|---|---|---|---|---|---|---|---|---|---|---|---|
| | | 20 | 30 | 40 | 50 | 60 | 70 | 80 | 90 | 100 | 110 | 120 | 130 | 140 |
| SiO2 film thickness (nm) | 120 | 6.5 | 5.9 | 6.8 | 9.0 | 11.8 | 14.6 | 16.7 | 17.9 | 17.9 | 16.7 | 14.5 | 11.6 | 8.8 |
| | 110 | 7.0 | 5.6 | 5.4 | 6.3 | 8.2 | 10.4 | 12.6 | 14.2 | 15.0 | 14.7 | 13.6 | 11.7 | 9.4 |
| | 100 | 8.4 | 6.7 | 5.6 | 5.3 | 5.9 | 7.2 | 8.9 | 10.6 | 11.9 | 12.6 | 12.5 | 11.7 | 10.3 |
| | 90 | 10.5 | 9.0 | 7.5 | 6.3 | 5.6 | 5.6 | 6.4 | 7.7 | 9.1 | 10.5 | 11.4 | 11.8 | 11.5 |
| | 80 | 12.9 | 12.1 | 10.7 | 9.0 | 7.3 | 6.0 | 5.5 | 5.9 | 7.1 | 8.7 | 10.4 | 11.9 | 12.7 |
| | 70 | 15.4 | 15.5 | 14.6 | 12.8 | 10.6 | 8.3 | 6.5 | 5.7 | 6.1 | 7.5 | 9.6 | 11.9 | 13.8 |
| | 60 | 14.7 | 18.6 | 18.5 | 17.2 | 14.9 | 12.0 | 9.2 | 7.1 | 6.3 | 7.1 | 9.2 | 11.9 | 14.7 |
| | 50 | 19.2 | 21.3 | 22.0 | 21.4 | 19.4 | 16.4 | 12.9 | 9.8 | 7.8 | 7.6 | 9.1 | 12.0 | 15.4 |

(c)

Red pixel

| | | SiN film thickness (nm) | | | | | | | | | | | | |
|---|---|---|---|---|---|---|---|---|---|---|---|---|---|---|
| | | 20 | 30 | 40 | 50 | 60 | 70 | 80 | 90 | 100 | 110 | 120 | 130 | 140 |
| SiO2 film thickness (nm) | 120 | 12.4 | 11.6 | 10.3 | 9.0 | 7.6 | 6.6 | 6.1 | 6.2 | 6.8 | 7.9 | 9.2 | 10.6 | 11.7 |
| | 110 | 14.0 | 13.9 | 13.2 | 11.9 | 10.3 | 8.6 | 7.2 | 6.2 | 5.8 | 6.3 | 7.3 | 8.8 | 10.5 |
| | 100 | 15.4 | 16.2 | 16.1 | 15.3 | 13.8 | 11.8 | 9.6 | 7.6 | 6.3 | 5.8 | 6.2 | 7.6 | 9.5 |
| | 90 | 16.6 | 18.2 | 18.9 | 18.7 | 17.5 | 15.5 | 13.0 | 10.3 | 8.0 | 6.5 | 6.1 | 6.9 | 8.7 |
| | 80 | 17.4 | 19.8 | 21.3 | 21.8 | 21.1 | 19.4 | 16.9 | 13.9 | 10.8 | 8.3 | 6.9 | 6.9 | 8.4 |
| | 70 | 17.9 | 20.9 | 23.2 | 24.3 | 24.3 | 23.1 | 20.8 | 17.7 | 14.2 | 10.9 | 8.6 | 7.7 | 8.4 |
| | 60 | 8.9 | 21.5 | 24.4 | 26.2 | 26.9 | 26.2 | 24.4 | 21.4 | 17.8 | 14.0 | 10.8 | 9.0 | 8.9 |
| | 50 | 17.5 | 21.5 | 24.9 | 27.4 | 28.7 | 28.6 | 27.3 | 24.8 | 21.2 | 17.2 | 13.5 | 10.7 | 9.6 |

Fig. 9

SOLID-STATE IMAGE SENSORS AND DISPLAY DEVICES HAVING ANTI-REFLECTION FILM

CROSS-REFERENCE TO RELATED APPLICATION

This application is a U.S. National Stage application claiming priority to, and the benefit of, International Application Number PCT/JP2006/321881, filed Nov. 1, 2006, incorporated herein by reference in its entirety. The International Application claims priority to, and the benefit of, Japan Application Number 2005-327344, filed on Nov. 11, 2005, incorporated herein by reference in its entirety.

TECHNICAL FIELD

The present invention relates to solid-state image sensors and display devices exhibiting reduced reflection loss, and to methods for manufacturing the same.

BACKGROUND ART

In recent years, video cameras and electronic cameras using a solid-state image sensor of a CCD (Charge Coupled Device) type, a CMOS (Complementary Metal Oxide Semiconductor) type (also referred to as an amplification type), or the like, have become widely used. In the solid-state image sensor, a plurality of pixel units is arranged in the form of a two-dimensional array, in which the pixel unit includes an optical receiving part that converts receiving light to an electrical signal, signal lines for reading the electrical signal of the optical receiving part, and the like. Light incident from a photogenic subject through a shooting lens of a video camera or electronic camera using a solid-state image sensor is focused on pixels of the sensor arranged in a matrix, converted to an electrical signal by the optical receiving part, and read as an image signal via the signal lines.

A typical solid-state image sensor has a structure in which a photodiode, which is an optical receiving part, is formed on a semiconductor substrate (silicon substrate). A transfer contact for forwarding an electric charge accumulated by the photodiode is formed via an insulation film, and on top thereof is an interlayer insulation film. The sensor further includes a light-shielding film for preventing light from striking any part of the sensor other than the optical receiving part, and a surface protection film. These layers and films are laminated in this order. However, with the solid-state image sensor having such a structure, incident light onto the optical receiving part reflects on a surface of the silicon substrate or a boundary face between the thin films. This reflection loss reduces the light reaching the photodiode, thus resulting in decreased sensitivity of the solid-state image sensor.

In particular, the refractive index of silicon is high, so there are more reflections from silicon and thus the reflection loss will increase. In order to solve this problem, a method for forming an anti-reflection film, such as a silicon nitride film (SiN), on the optical receiving part, thereby reducing the reflection loss of incident light and improving the sensitivity of the solid-state image sensor, has been contemplated. For example, Japan Unexamined Patent Application Publication No. 2000-196051 (referred to herein as "Patent Document 1") describes a double layer structure of high-refractive-index layer for reducing the reflection loss of incident light near a wavelength of 550 nm. Moreover, Japan Unexamined Patent Application Publication No. 2005-142510 (referred to herein as "Patent Document 2") describes a method for optimizing the reflection loss by changing the film thickness of each pixel with a single layer of anti-reflection film.

Moreover, the reflectivity characteristic is a critical issue not only in the solid-state image sensor but also in display devices, such as liquid crystal display devices and EL (Electro Luminescent Display) devices. Thus, there is a need for an anti-reflection structure having a low reflectivity characteristic over a wide range of visible light. For example, Japan Unexamined Patent Application Publication No. H10-311903 (Referred to herein as "Patent Document 3") describes the following technique. A high-refractive-index layer having a refractive index from 1.9 to 2.5 and a low-refractive-index layer having a refractive index from 1.3 to 1.5 are laminated alternatingly on a transparent material to provide an anti-reflection layer as the anti-reflection material of a display device. The high-refractive-index layer and low-refractive-index layer are composed of metallic oxides having different refractive indices. Each of the laminated high-refractive-index layers and each of the laminated low-refractive-index layers are formed of the same metallic oxide. The refractive indices of the laminated layers are designed so as to increase in the order of their positions nearer to the transparent material. Thus, this technique achieves a low refractive index in the visible optical range.

DISCLOSURE

Problems to be Solved

FIG. 17 is a graph showing the spectral reflectivity of a single layer of high-refractive-index layer in accordance with the prior art. Although not described in Patent Document 2, based on a calculation performed by the present inventor, in an optical system including an interlayer insulation film, a microlens, and the like, even if the optimization is made using the method described in Patent Document 2, there may still be a reflection loss as high as 10%.

FIG. 18 is a graph showing a spectral reflectivity of a double layer of high-refractive-index layers in accordance with the prior art. It may be seen that with the structure described in Patent Document 1, as shown in FIG. 18, the reflection loss of green light near a wavelength of 550 nm is reduced to 6.7%. However, the reflectivity for blue light near a wavelength of 450 nm and the reflectivity for red light near a wavelength of 600 nm contrarily increase as compared with those of the structure having a single layer of high-refractive-index layer shown in FIG. 17. Namely, high reflectivity means that the reflection loss is high and the sensitivity of the solid-state image sensor is low, so that the structure described in Patent Document 1 has a problem in that the sensitivity for red light and blue light will decrease while the sensitivity for green light is high.

With the structure as shown in Patent Document 1, the variation in reflectivity due to the margin of manufacturing error of the films of blue light and red light will increase, resulting in a variation in the sensitivity of solid-state image sensors. Since this variation in sensitivity is higher than the variation in an amplifier of the solid-state image sensor, the quality cannot be maintained and the production yield of the solid-state image sensors will decrease significantly. This is also true of display devices, such as a liquid crystal display device and an EL device. With the anti-reflection structure common to the respective colors as introduced in Patent Document 3, it is difficult to reduce the reflection loss in all the colors. There is thus no other choice but to employ some trade-off design instead of the optimum design for each color.

An object of the present invention is to provide solid-state image sensors and display devices having high sensitivity for all of green light, red light, and blue light and having an anti-reflection film including two or more layers of high-refractive-index layers. Thus, solid-state image sensors and display devices are provided having small variation in sensitivity and small reflection loss. Also provided are manufacturing methods for making such sensors.

Means for Solving the Problems

A solid-state image sensor having an anti-reflection film of the present invention includes an optical unit that separates incident light into a plurality of color elements, an optical receiving unit which converts the each of color elements separated by the optical unit to an electrical signal, and an anti-reflection film including a high-refractive-index layer having a refractive index of 1.7 or higher and a low-refractive-index layer having a refractive index of less than 1.7. The anti-reflection film is provided, on a semiconductor substrate, between the optical unit and the optical receiving unit for each of color elements. Each of the high-refractive-index layer and the low-refractive-index layer, corresponding to at least one color element of the plurality of color elements, includes two or more layers.

Alternatively, a solid-state image sensor includes an optical unit separating incident light into a plurality of color elements, an optical receiving unit which converts the each of color elements separated by the optical unit to an electrical signal, and an anti-reflection film including high-refractive-index layers of two or more layers having a refractive index of 1.7 or higher and low-refractive-index layers of two or more layers having a refractive index of less than 1.7. The anti-reflection film is provided, on a semiconductor substrate, between the optical unit and the optical receiving unit for each of color elements. One of a film thickness and a film material of at least one layer of the high-refractive-index layers and the low-refractive-index layers differs for the each of color elements.

Also provided are display devices having an anti-reflection film. The display device having an anti-reflection film includes a high-refractive-index layer and a low-refractive-index layer that allow transmission of light of each color element therethrough. The anti-reflection film includes two or more layers of the high-refractive-index layers and the low-refractive index-layers corresponding to at least one color element of the respective color elements.

Alternatively, a display device having an anti-reflection film includes two or more layers of high-refractive-index layers and two or more layers of low-refractive-index layers that allow transmission of light of each color element therethrough. One of a film thickness and a film material of the high-refractive-index layer and the low-refractive-index layer constituting the anti-reflection film differs for the each of color elements.

Methods are provided for manufacturing a solid-state image sensor having an anti-reflection film. The solid-state image sensor includes an optical unit separating incident light into a plurality of color elements, an optical receiving unit which converts the each of color elements separated by the optical unit to an electrical signal, and an anti-reflection film including a high-refractive-index layer having a refractive index of 1.7 or higher and a low-refractive-index layer having a refractive index of less than 1.7. The anti-reflection film is provided between the optical unit and the optical receiving unit for each of color elements, on a semiconductor substrate. The method includes the steps of forming a first low-refractive-index layer on the semiconductor substrate; forming a first high-refractive-index layer on the first low-refractive-index layer; forming a second low-refractive-index layer on the first high-refractive-index layer; forming a second high-refractive-index layer on the second low-refractive-index layer; masking a surface of the second high-refractive-index layer corresponding to at least one color element of the plurality of color elements to remove the second high-refractive-index layer in an unmasked portion; and masking the optical receiving unit to remove the second high-refractive-index layer, the second low-refractive-index layer, and the first high-refractive-index layer in an unmasked portion.

Other methods are provided for manufacturing a solid-state image sensor having an optical unit separating incident light into three color elements, an optical receiving unit which converts the each of color elements separated by the optical unit to an electrical signal, and an anti-reflection film including a high-refractive-index layer having a refractive index of 1.7 or higher and a low-refractive-index layer having a refractive index of less than 1.7. The anti-reflection film is provided between the optical unit and the optical receiving unit for each of color elements, on a semiconductor substrate. The method includes the steps of forming a first low-refractive-index layer on the semiconductor substrate; forming a first high-refractive-index layer on the first low-refractive-index layer; forming a second low-refractive-index layer on the first high-refractive-index layer; forming a second high-refractive-index layer on the second low-refractive-index layer; masking a surface of the second high-refractive-index layer corresponding to a first color element of the three color elements to remove the second high-refractive-index layer in an unmasked portion; forming a third low-refractive-index layer on the second high-refractive-index layer as well as on the second low-refractive-index layer on which the second high-refractive-index layer is removed; forming a third high-refractive-index layer on the third low-refractive-index layer; masking a surface of the third high-refractive-index layer corresponding to a second color element of the three color elements to remove the third high-refractive-index layer in an unmasked portion; forming a fourth low-refractive-index layer on the third high-refractive-index layer as well as on the third low-refractive-index layer on which the third high-refractive-index layer is removed; forming a fourth high-refractive-index layer on the fourth low-refractive-index layer; masking a surface of the fourth high-refractive-index layer corresponding to a third color element of the three color elements to remove the fourth high-refractive-index layer in an unmasked portion; and masking the optical receiving unit to remove the fourth high-refractive-index layer, the fourth low-refractive-index layer, the third high-refractive-index layer, the third low-refractive-index layer, the second high-refractive-index layer, the second low-refractive-index layer, and the first high-refractive-index layer in an unmasked portion.

With solid-state image sensors as disclosed herein, it is possible to provide solid-state image sensors having high sensitivity for all of green light, red light, and blue light by optimizing an anti-reflection structure for each color on an R pixel, a B pixel, and a G pixel. In particular, in a solid-state image sensor having an anti-reflection film including two or more layers of high-refractive-index layers, the variation in sensitivity due to the variation in reflectivity can be suppressed and it is therefore possible to provide solid-state image sensors with a high production yield.

BRIEF DESCRIPTION OF THE DRAWINGS

FIGS. 9(a) to 9(c) are explanatory tables showing an example of design calculation of the first, second, and third embodiments.

DETAILED DESCRIPTION OF THE EMBODIMENTS

Figure 7:
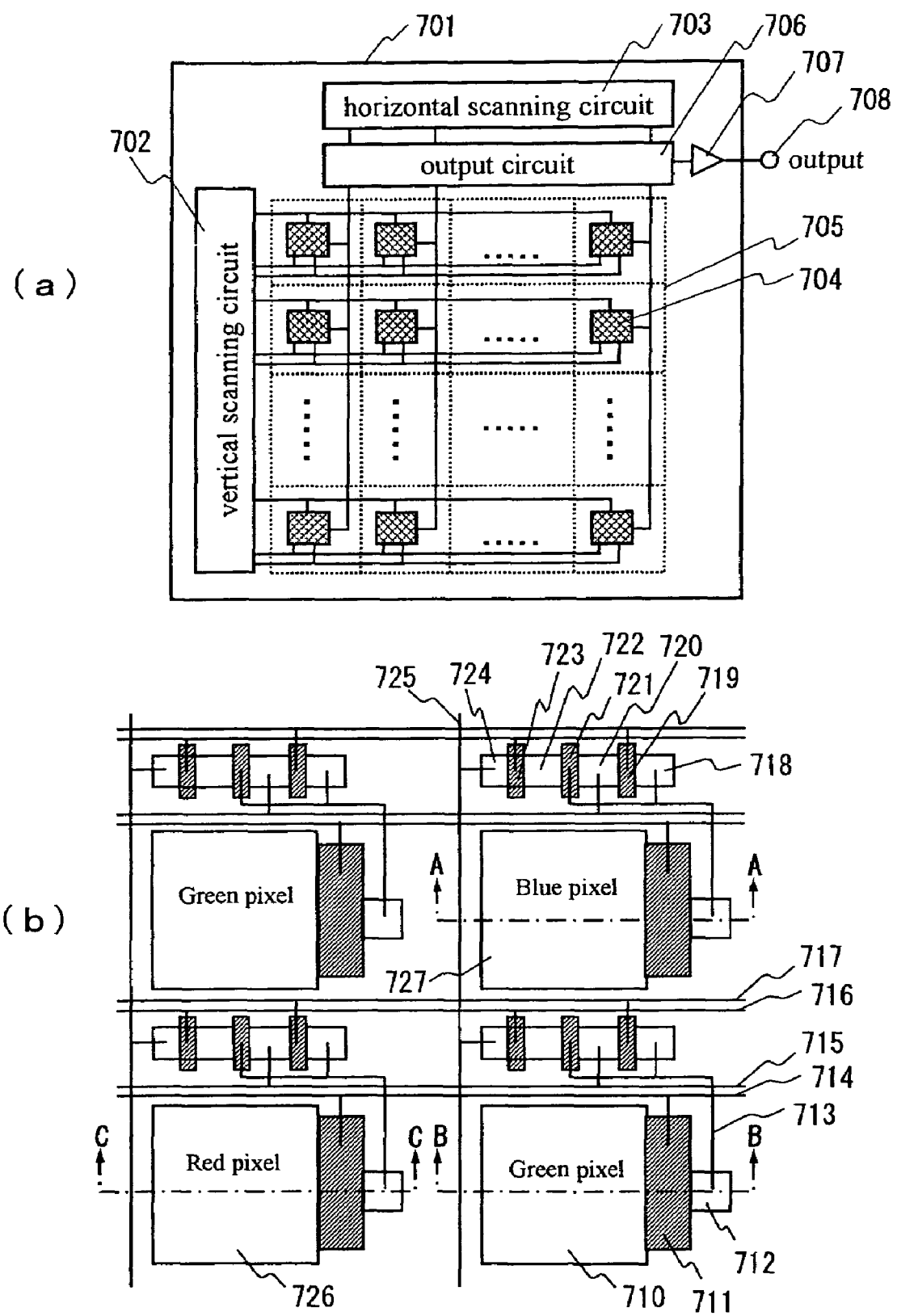
FIGS. 7(a) and 7(b) show plan views of solid-state image sensors of the first, second, and third embodiments.

Basic features of the subject solid-state image sensors will be described using FIGS. 7(a) and 7(b) before describing specific embodiments. FIG. 7(a) shows a plan view of a solid-state image sensor, in which reference numeral 701 represents the solid-state image sensor, 702 represents a vertical scanning circuit, 703 represents a horizontal scanning circuit, 704 represents a semiconductor device such as a photodiode constituting a pixel, 705 represents one block of pixel units surrounded by a dotted line, 706 represents a read circuit of an image signal, 707 represents an output amplifier, and 708 represents an output terminal for an image signal, respectively. In the view, an electrical signal output by the semiconductor device 704, such as the photodiode of the unit of each pixel 705, is taken out to the read circuit 706 in the unit of row by way of the vertical scanning circuit 702, and is then output as an image signal to the output terminal 708 via the output amplifier 707 in the unit of column by way of the horizontal scanning circuit 703. Moreover, the unit of each pixel 705 is allocated for a B pixel for capturing blue light, a G pixel for capturing green light, and an R pixel for capturing red light, respectively. In the present embodiment the unit of each pixel 705 is described as a solid-state image sensor in a typical bayer array.

FIG. 7(b) is a plan view of four pixels of the pixel unit 705 (2 pixels vertically and 2 pixels horizontally). In FIG. 7(b), reference numeral 710 represents a photodiode for a G pixel; 711 represents the gate of a transfer transistor; 712 represents the drain of the transfer transistor; 713 represents wiring; 714 represents a transfer signal line; 715 represents a power supply; 716 represents a selection signal line; 717 represents a reset signal line; 718 represents the source of a reset transistor; 719 represents the gate of the reset transistor; 720 represents a power supply portion, 721 represents the gate of an amplification transistor; 722 represents the drain of the amplification transistor; 723 represents the gate of the selection transistor; 724 represents the drain of the selection transistor; 725 represents a vertical signal line; 726 represents a photodiode of an R pixel; and 727 represents a photodiode of a B pixel, respectively. Since the B pixel, G pixel, and R pixel have the same configuration, reference numerals for elements with the same configuration are omitted.

The cutout line A of FIG. 7(b) indicates a section position of the pixel unit of the B pixel, the cutout line B indicates a section position of the pixel unit of the G pixel, and the cutout line C indicates a section position of the pixel unit of the R pixel, respectively. Note that, in views used in the description of each of the embodiments below, the representations of R pixel, G pixel, and B pixel illustrate the one cut at the section position A, B, or C corresponding to the respective pixels of FIG. 7(b).

Next, the operation of the pixel of this solid-state image sensor is described briefly. In FIG. 7(b), a method or structure for reading a signal from a photodiode in the unit of each pixel is the same for all the R pixel, G pixel, and B pixel. Thus, the reference numerals in the view will be described assuming the same element of each color is common. The drain 712 of the transfer transistor, the wiring 713, the source 718 of the reset transistor, and the gate 721 of the amplification transistor are collectively referred to as a floating diffusion. First, upon application of a reset signal from the reset signal line 717 to the gate 719 of the reset transistor, the floating diffusion is set to a reset level. Next, upon application of a transfer signal to a gate 711 of the transfer transistor, electric charge accumulated by the photodiode 710 is transferred to the floating diffusion. Then, upon application of a selection signal to the gate 723 of the selection transistor, a signal corresponding to an amount of the accumulated electric charge is amplified by the amplification transistor and output to the vertical signal line 725. Since these operations of the solid-state image sensor are commonplace, further detailed description thereof is omitted.

First Embodiment

Figure 1:
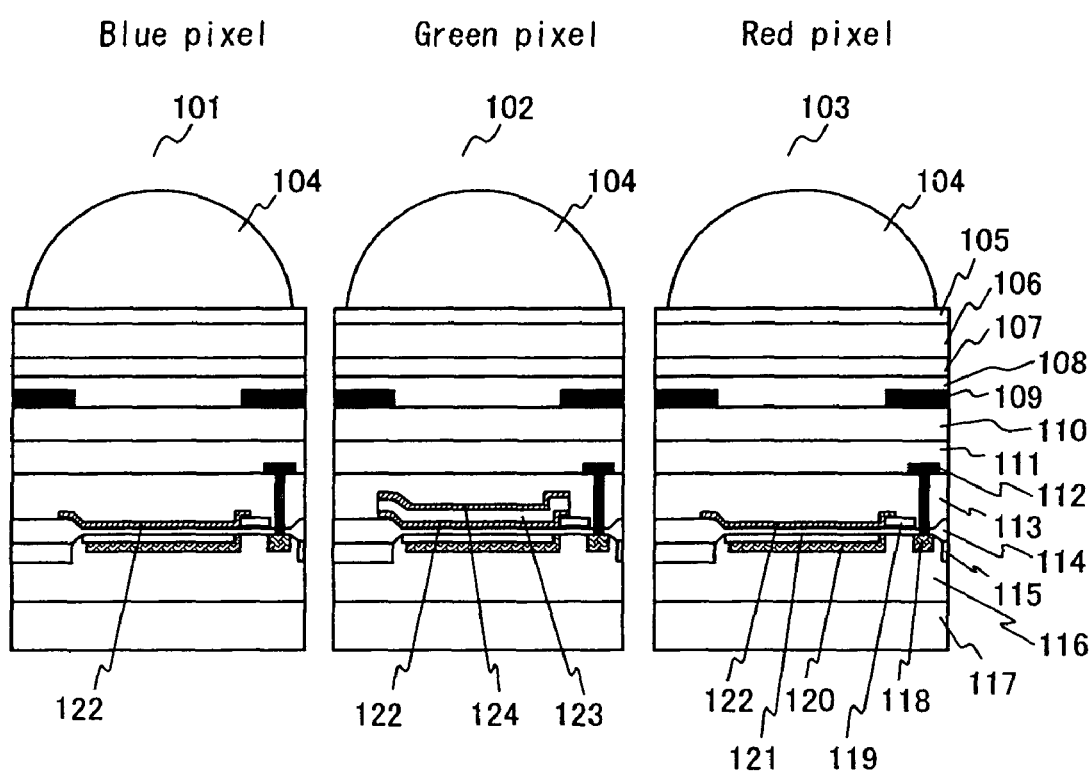
FIG. 1 shows cross sections of blue (B), green (G), and red (R) pixels of a first embodiment.

A first embodiment will be described with reference to FIG. 1. FIG. 1 shows an embodiment of a solid-state image sensor having an anti-reflection film including a single layer of high-refractive-index layer for the B pixel and R pixel and a double layer of high-refractive-index layers for the G pixel. FIG. 1 represents the cross sections cut at the previously described cutting positions A, B, and C of FIG. 7(b). In FIG. 1, reference numeral 101 represents the cross section of the B pixel when cut at the cutting position A; 101 represents the cross section of the G pixel when cut at the cutting position B; 103 represents the cross section of the R pixel when cut at the cutting position C; 104 represents a microlens; 105 and 107 represent planarizing layers; 106 represents a color filter; 108 represents a protection film; 109 represents a light-shielding film; 110, 111 and 113 represent interlayer insulation films; 112 represents aluminum wiring; 114 and 123 represent silicon oxide films ($SiO_2$) forming low-refractive-index layers having refractive index of less than 1.7; 115 represents a separation layer; 116 represents a well area; 117 represents a semiconductor substrate; 119 represents a transfer gate; 118 represents the drain area of the transfer gate 119; 120 represents an electric charge accumulation layer constituting a photodiode; 121 represents a protection layer of surface depletion constituting a photodiode; and 122 and 124 represent silicon nitride films forming a high-refractive-index layer having a refractive index of 1.7 or higher, respectively. Note that each of the reference numerals given to the cross section of the R pixel is omitted in the cross sections of the B pixel and R pixel.

Figure 8:
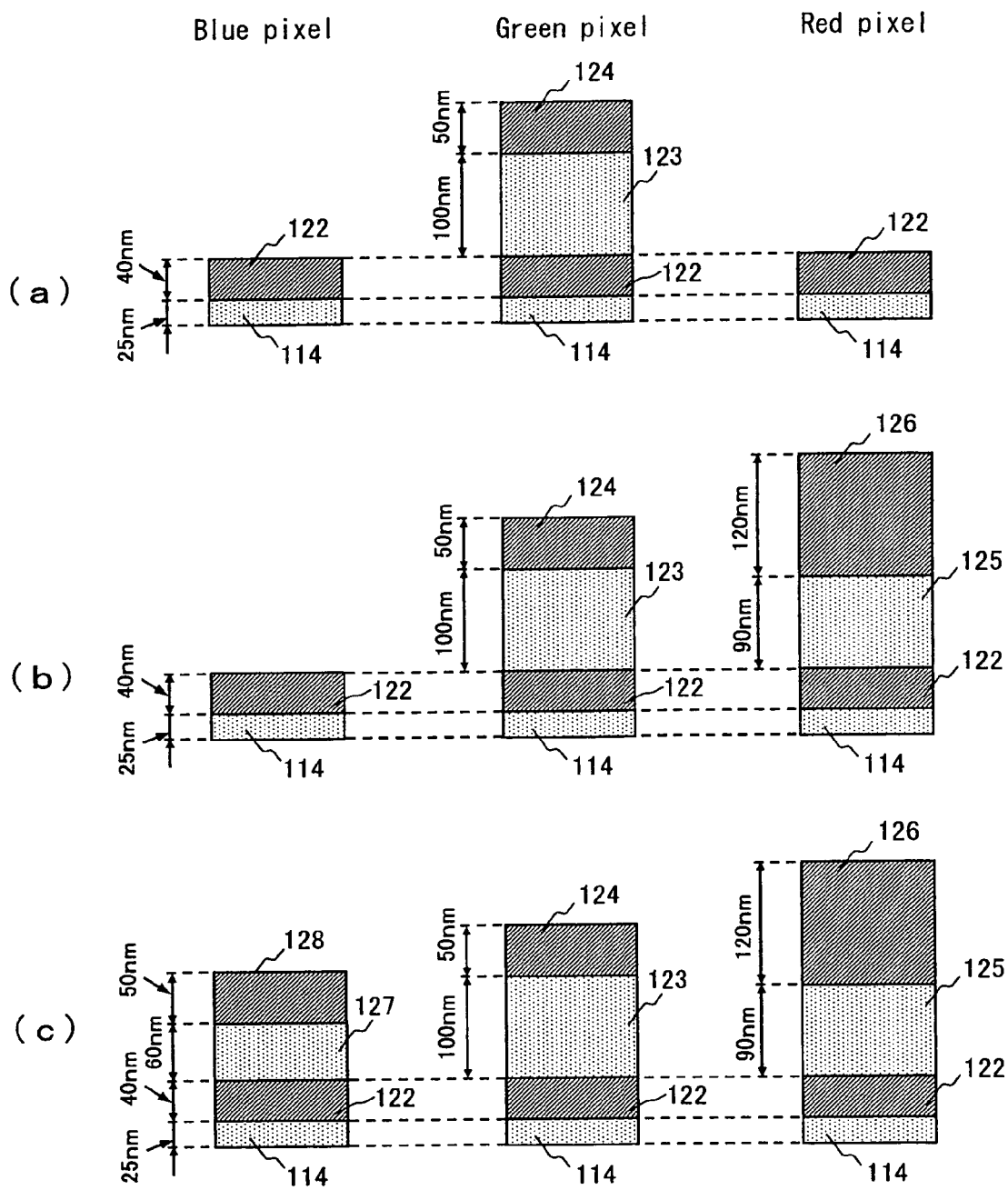
FIGS. 8(a) to 8(c) show cross sections illustrating differences among the first, second, and third embodiments.

In FIG. 1, in the B pixel 101 and the R pixel 103, the silicon oxide film 114 used as a low-refractive-index layer is formed in a film thickness of 25 nm on the well area 116 and the protection layer of surface depletion 121, in which a photodiode is formed, and further on top thereof the silicon nitride film 122 used as a high-refractive-index layer is formed in a film thickness of 40 nm, respectively. In the G pixel 102, the silicon oxide film 114 used as a low-refractive-index layer is formed in a film thickness of 25 nm on the well area 116 and the protection layer of surface depletion 121, and further on top thereof the silicon nitride film 122 used as a high-refractive-index layer is formed in a film thickness of 40 nm, respectively. So far the structure is the same as those of the B pixel 101 and R pixel 103. However, in the case of the G pixel 102, further on top thereof, the silicon oxide film 123 used as the low-refractive-index layer is formed in a film thickness of 100 nm and the silicon nitride film 124 used as the high-refractive-index layer is formed in a film thickness of 50 nm, respectively. These anti-reflection films are magnified and shown in FIG. 8(*a*). The B pixel and the R pixel, respectively, includes a single layer of the silicon oxide film 114 and a single layer of the silicon nitride film 122, while only in the G pixel, the silicon oxide film 114, the silicon nitride film 122, the silicon oxide film 123, and the silicon nitride film 124 are laminated in this order as having a double layer of silicon oxide films and a double layer of silicon nitride films, respectively.

On top of the above-described anti-reflection films of the B pixel 101, R pixel 103, and G pixel 102, the interlayer insulation films 113, 111 and 110, the protection film 108, the color filter 106, the planarizing films 107 and 105, and the microlens 104 are formed in the pixel of each color, respectively. The manufacturing method thereof will be described in detail later.

Figure 2:
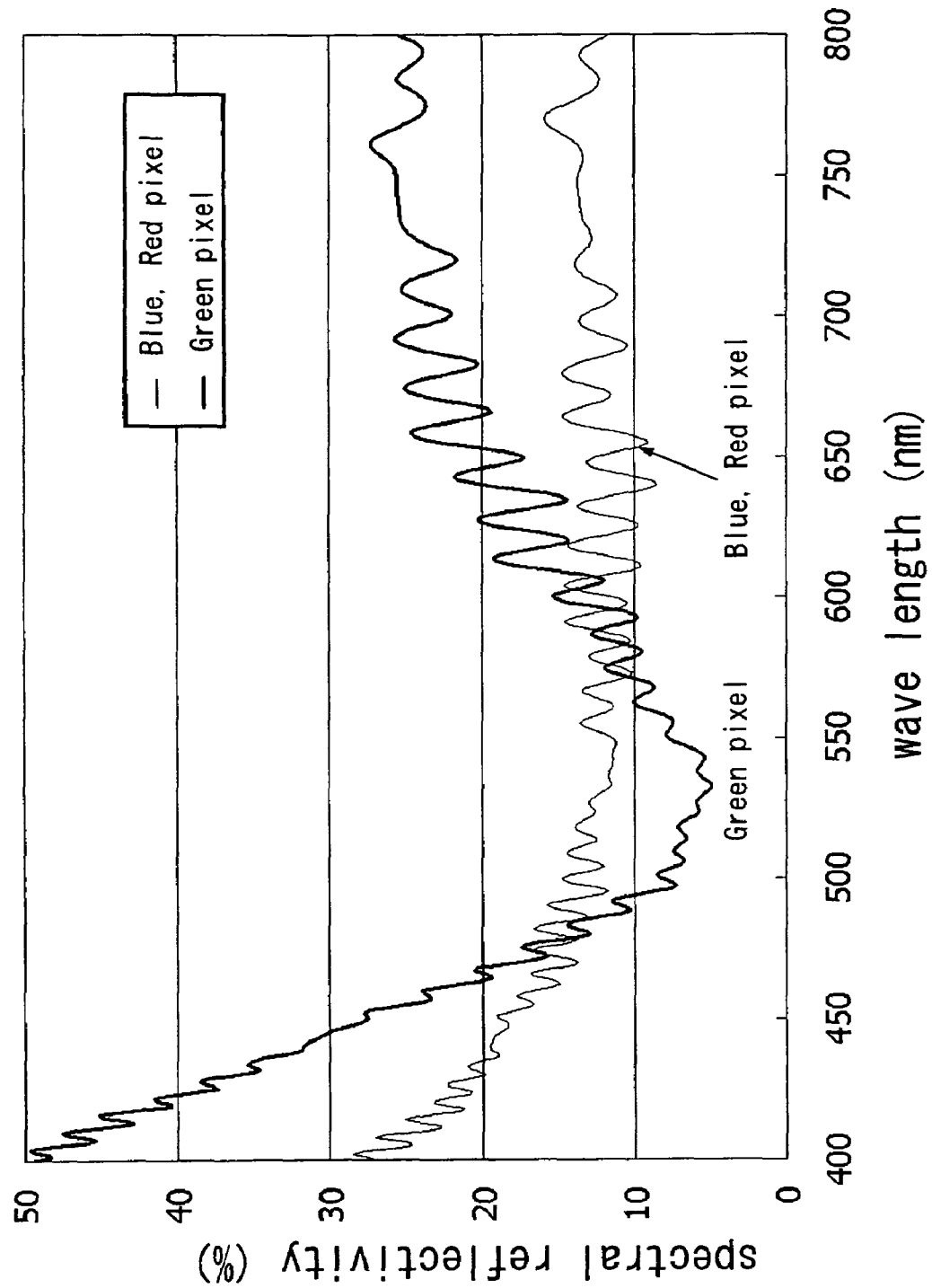
FIG. 2 is a plot of the spectral reflectivity of the first embodiment.

Next, the optical characteristic of the solid-state image sensor in the first embodiment is described with reference to FIG. 2. FIG. 2 is a plot of the spectral reflectivity characteristic, where the horizontal axis represents wavelength and the vertical axis represents reflectivity. The smaller the reflectivity, the smaller the reflection loss becomes and the higher the sensitivity as the solid-state image sensor becomes. In FIG. 2, the maximum value of the variation of the reflectivity at each wavelength is as follows:

B pixel (450 nm): 18.9+16.1%;
G pixel (530 nm): 5.3+8.0%; and
R pixel (600 nm): 11.5+14.7%.

The above maximum variation represents (center value+variation) and the variation indicates an increment in reflectivity, so that the maximum reflectivity due to the variation is a sum of the two values.

Figure 16:
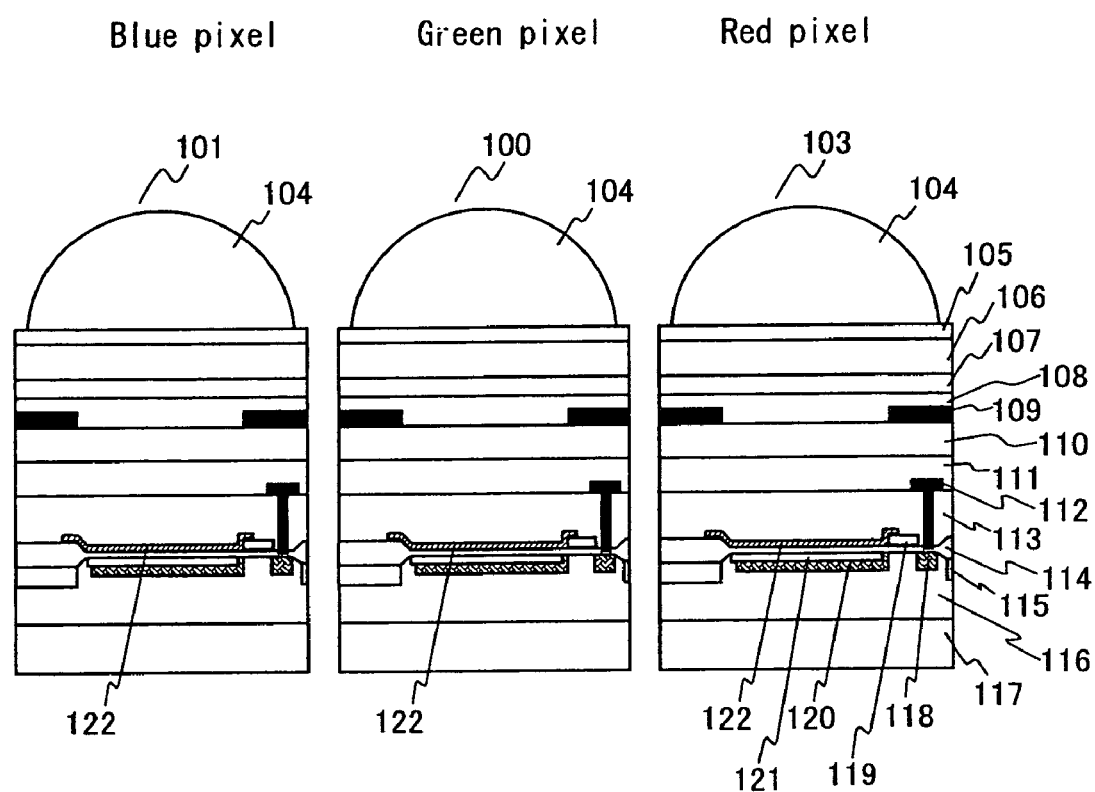
FIG. 16 shows cross sections of B, G, and R pixels including a single layer of high-refractive-index material, according to the prior art.
Figure 17:
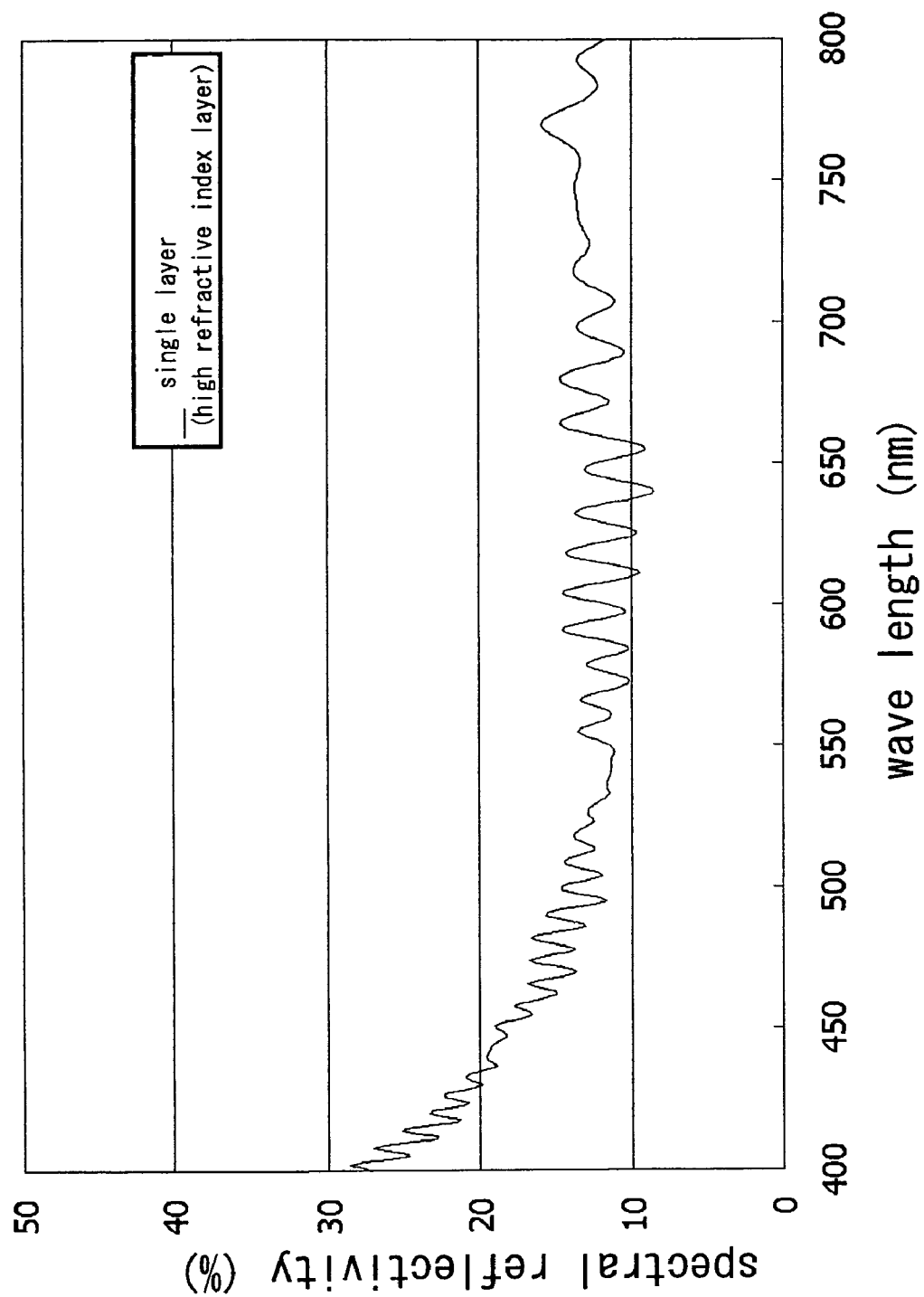
FIG. 17 is a plot of the spectral reflectivity of the single layer of high-refractive-index layer, according to the prior art.

In contrast, in the case of the single layer of high-refractive-index layer according to the prior art shown in the cross section of FIG. 16, all of the R pixel, G pixel, and B pixel have a single layer structure of the silicon nitride film 122 forming the high-refractive-index layer. With reference to the spectral reflectivity characteristic shown in FIG. 17, it may be seen that especially the characteristic of the G pixel 100 is significantly poor as compared with that of FIG. 2. The maximum value of the variation of the reflectivity at each wavelength of FIG. 17 is as follows:

B pixel (450 nm): 16.0+15.6%;
G pixel (530 nm): 10.2+12.3%; and
R pixel (600 nm): 10.1+13.5%.

Here, the reflectivity near the wavelength of 530 nm can be significantly reduced down to 5.3% in the first embodiment, while it was about 10% in the case of the anti-reflection film having a single layer of high-refractive-index layer of the prior art.

Figure 18:
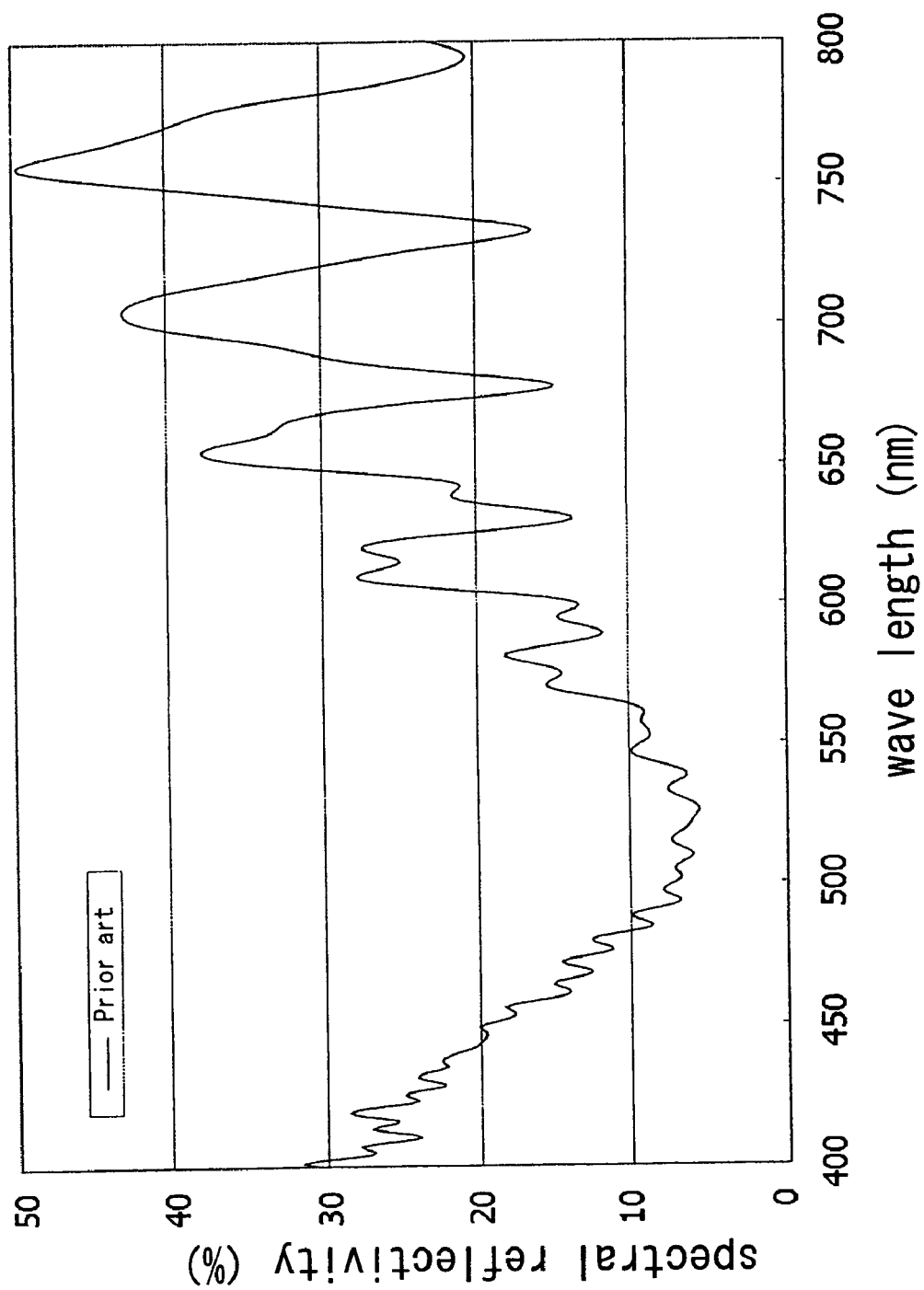
FIG. 18 is a plot of the spectral reflectivity of a double layer of high-refractive-index layers, according to the prior art.

On the other hand, with regard to the variation in sensitivity, generally, in a portion where the reflectivity changes sharply, the influence of manufacturing variation in film thickness increases, so that the variation in reflectivity will increase. This results in the variation in the light serving as a signal absorbed inside the silicon, thereby increasing the variation in signal charges. Thus, the variation in sensitivity will increase. In contrast, in a portion where the reflectivity is near the minimum value, the influence of the manufacturing variation decreases and thus the variation in reflectivity will also decrease. In particular, with such anti-reflection structure having a double layer of high-refractive-index layers as the one described in Patent Document 1, the variations in reflectivities of the B pixel and R pixel also increase and thus the variation in reflectivity will increase. If a color filter, a microlens, and the like are applied to the case of Patent Document 1 and the spectral reflectivity characteristic is calculated, then the result shown in FIG. 18 is obtained, where the characteristics in the R pixel and B pixel become poorer. Furthermore, the maximum value of the variation of the reflectivity at each wavelength assuming a 5% variation in the film thickness of each film is as follows:

B pixel (450 nm): 19.7+25.6%;
G pixel (530 nm): 6.7+15.0%; and
R pixel (600 nm): 13.4+34.4%.

In this way, the solid-state image sensor according to the first embodiment can increase the sensitivity in the G pixel as compared with the anti-reflection film having a single layer of high-refractive-index layer according to the prior art, and further can increase the sensitivity in the B pixel and the sensitivity in the R pixel as compared with the anti-reflection film having a double layer of high-refractive-index layers according to Patent Document 1. Furthermore, the variation in sensitivity caused by the variation in reflectivity generated from the variation in film thickness during production can be reduced. Note that although the causes of the variation in reflectivity in the case of a solid-state image sensor typically include the variation in amplifier gains, the variation according to this embodiment is approximately comparable with this gain variation and is thus not a problem.

Second Embodiment

Figure 3:
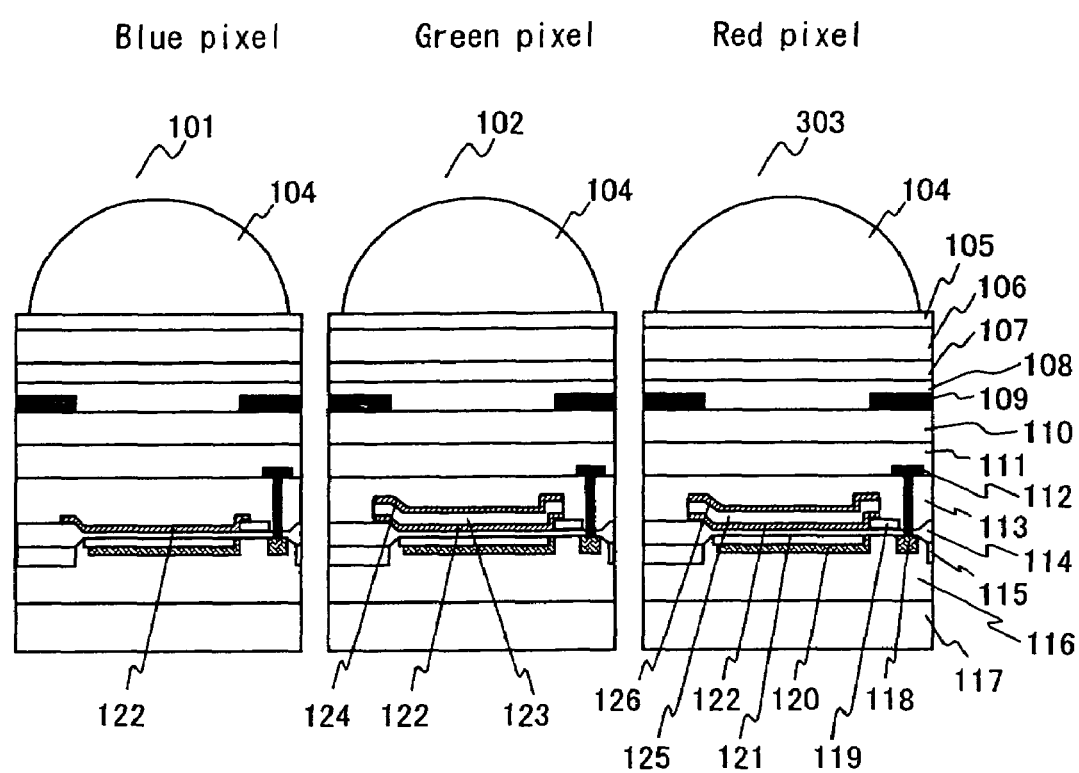
FIG. 3 shows cross sections of B, G, and R pixels of a second embodiment.

Next, a second embodiment of the present invention is described in detail with reference to FIG. 3. FIG. 3 shows an embodiment of a solid-state image sensor having an anti-reflection film including a single layer of high-refractive-index layer for the B pixel and a double layer of high-refractive-index layers for the R pixel and G pixel, and represents the cross sections cut at the previously described cutting positions A, B, and C of FIG. 7(b). In FIG. 3, reference numeral 101 represents the cross section of the B pixel when cut at the cutting position A, 102 represents the cross section of the G pixel when cut at the cutting position B, 303 represents the cross section of the R pixel when cut at the cutting position C, 125 represents a silicon oxide film forming a low-refractive-index layer having a refractive index of less than 1.7, and 126 represents a silicon nitride film forming a high-refractive-index layer having a refractive index of 1.7 or higher, respectively. Since the elements denoted by the same reference numerals as the one described in FIG. 1 of the first embodiment represent the same elements, the descriptions thereof are omitted.

In FIG. 3, the difference from the first embodiment is only in the R pixel. In the B pixel 101, as in the first embodiment, in the order from the silicon substrate side, the silicon oxide film 114 used as the low-refractive-index layer is formed in a film thickness of 25 nm and the silicon nitride film 122 used as the high-refractive-index layer is formed in a film thickness of 40 nm. Also, in the G pixel 102, as in the first embodiment, in the order from the silicon substrate side, the silicon oxide film 114 used as the low-refractive-index layer is formed in a film thickness of 25 nm, the silicon nitride film 122 used as the high-refractive-index layer is formed in a film thickness of 40 nm, and on top thereof the silicon oxide film 123 used as the low-refractive-index layer is formed in a film thickness of 100 nm and further the silicon nitride film 124 used as the high-refractive-index layer is formed in a film thickness of 50 nm.

In the R pixel 303, similarly, in the order from the silicon substrate side, the silicon oxide film 114 used as the low-refractive-index layer has a film thickness of 25 nm, and the silicon nitride film 122 used as the high-refractive-index layer has a film thickness of 40 nm, but from here, unlike the first embodiment, on top thereof the silicon oxide film 125 used as the low-refractive-index layer is formed in a film thickness of 90 nm and further the silicon nitride film 126 used as the high-refractive-index layer is formed in a film thickness of 120 nm.

These anti-reflection films are magnified and shown in FIG. 8(b). The B pixel includes the single layer of the silicon oxide film 114 and the single layer of silicon nitride film 122, while in the G pixel, as in the first embodiment, the silicon oxide film 114, the silicon nitride film 122, the silicon oxide film 123, and the silicon nitride film 124 are laminated in this order as having a double layer of silicon oxide films and a double layer of silicon nitride films, respectively, and further in the R pixel, the silicon oxide film 114, the silicon nitride film 122, the silicon oxide film 125, and the silicon nitride film 126 are laminated in this order as having a double layer of silicon oxide films and a double layer of silicon nitride films, respectively. Moreover, as shown in FIG. 3, on top of the above-described anti-reflection films of the B pixel 101, R pixel 303, and G pixel 102, the interlayer insulation films 113, 111 and 110, the protection film 108, the color filter 106, the planarizing films 107 and 105, and the microlens 104 are formed in the pixel of each color, respectively.

Figure 4:
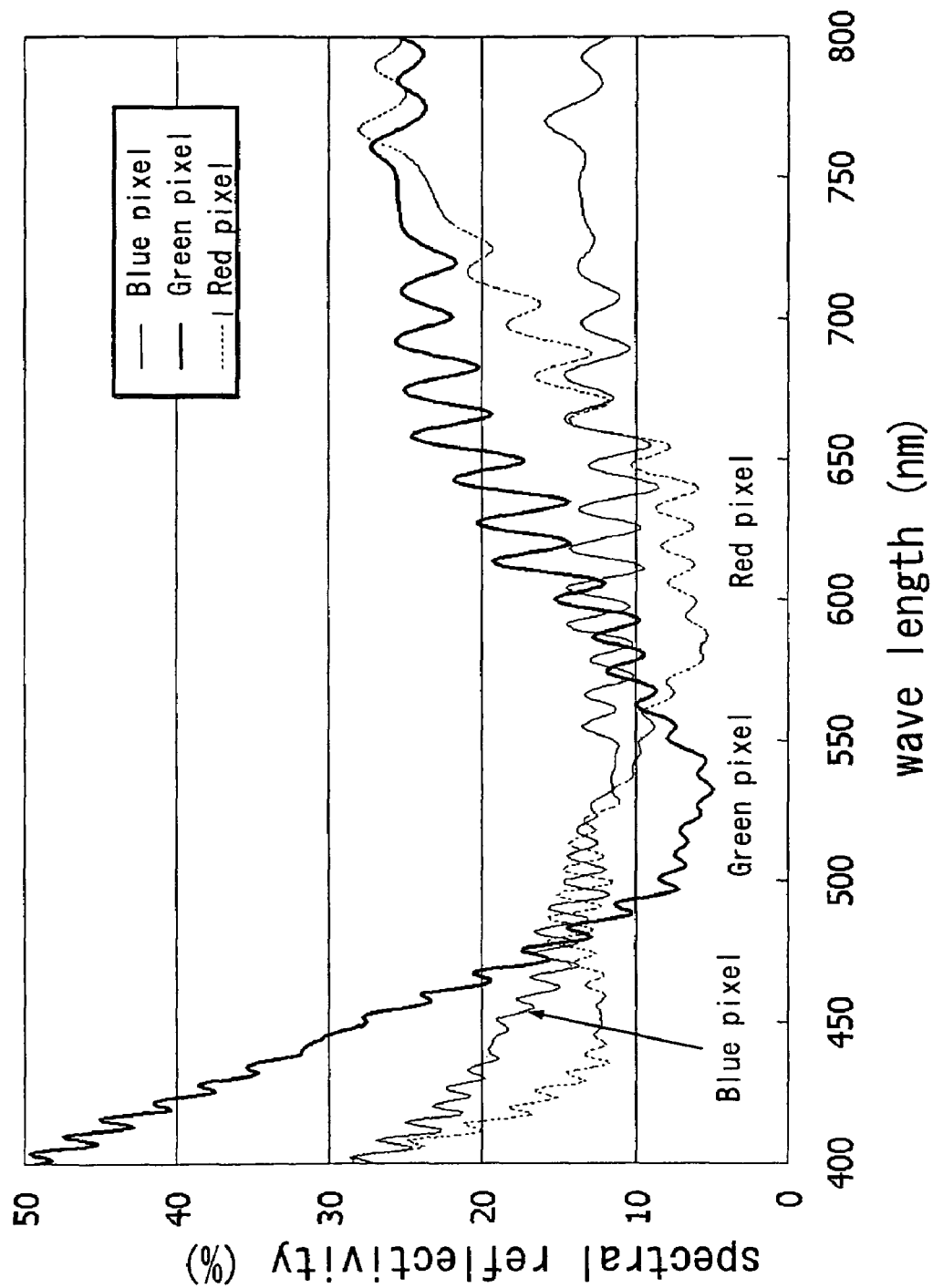
FIG. 4 is a plot of the spectral reflectivity of the second embodiment.

Next, the optical characteristic of the solid-state image sensor in the second embodiment will be described with reference to FIG. 4. FIG. 4 shows, as in FIG. 2, a plot of the spectral reflectivity characteristic, where the horizontal axis represents wavelength and the vertical axis represents reflectivity. It may be seen that, in the second embodiment, in addition to the decrease in the spectral reflectivity for green light of the G pixel as in the first embodiment, the spectral reflectivity for red light of the R pixel can be also reduced. The reflectivity near the wavelength of 600 nm can be reduced down to 6.1% in FIG. 4 of the second embodiment, while in FIG. 2 of the first embodiment it was about 10%. Furthermore, the variation in reflectivity generated in the R pixel due to the manufacturing variation of each film thickness can be reduced down to 8.4% as shown below in the second embodiment, while in the first embodiment it was 14.7%:

B pixel (450 nm): 18.9+16.1%;
G pixel (530 nm): 5.3+8.0%; and
R pixel (600 nm): 6.1+8.4%.

Note that the above represents reflectivity+variation at each wavelength determined by calculation, as in the first embodiment. In this way, the reflectivity for red light of the R pixel can be also reduced in the second embodiment, so that the sensitivity of the solid-state image sensor for red light can be increased. The variation in reflectivity of red light generated due to the manufacturing variation can be also reduced as compared with the first embodiment.

Third Embodiment

Figure 5:
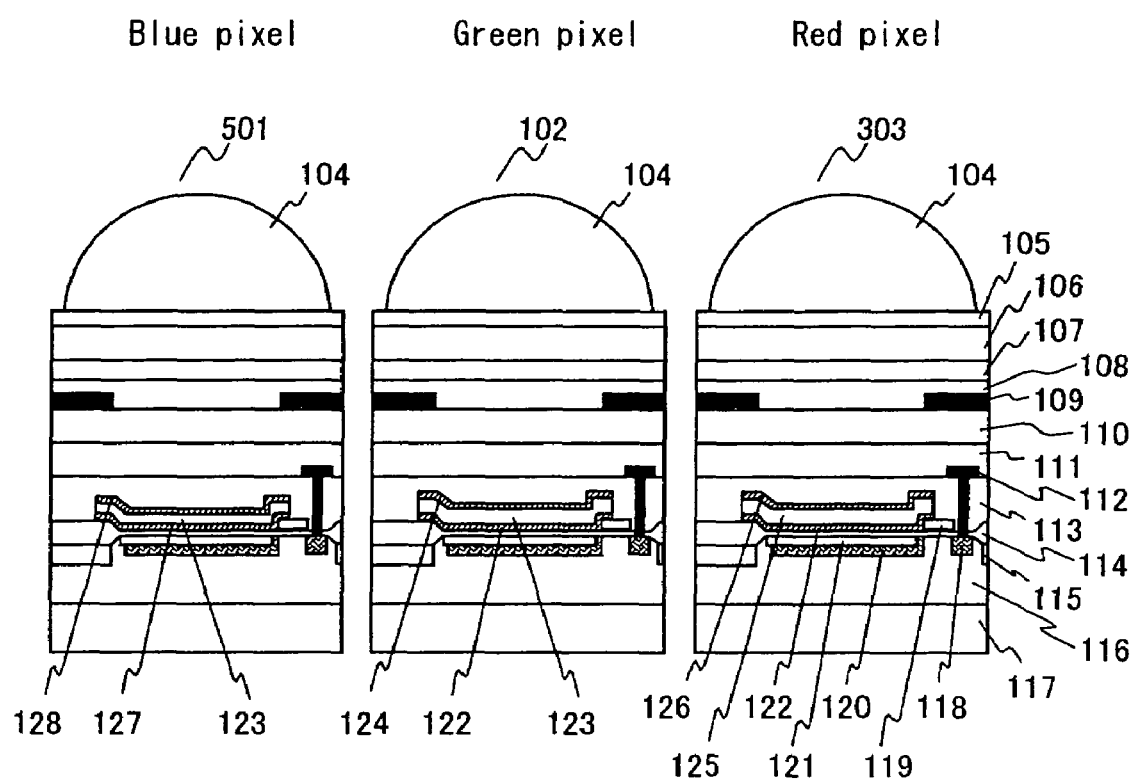
FIG. 5 shows cross sections of B, G, and R pixels of a third embodiment.

Next, a third embodiment of the present invention will be described in detail with reference to FIG. 5. FIG. 5 shows an embodiment of a solid-state image sensor having an anti-reflection film including a double layer of high-refractive-index layers for all the B pixel, G pixel, and R pixel, and represents the cross sections cut along the previously described cutting positions A, B, and C of FIG. 7(b). In FIG. 5, reference numeral 101 represents the cross section of the B pixel when cut at the cutting position A; 102 represents the cross section of the B pixel when cut at the cutting position B; 303 represents a cross section of the C pixel when cut at the cutting position C; 127 represents a silicon oxide film forming a low-refractive-index layer having a refractive index of less than 1.7; and 128 represents a silicon nitride film forming a high-refractive-index layer having a refractive index of 1.7 or higher, respectively. Since elements denoted by the same reference numerals as the one described in FIG. 1 of the first embodiment and in FIG. 3 of the second embodiment represent the same elements, the descriptions thereof are omitted.

In FIG. 5, the difference from the second embodiment is only in the B pixel. In the G pixel 102, as in the first embodiment, in the order from the silicon substrate side, the silicon oxide film 114 used as the low-refractive-index layer is formed in a film thickness of 25 nm; the silicon nitride film 122 used as the high-refractive-index layer is formed in a film thickness of 40 nm; on top thereof the silicon oxide film 123 used as the low-refractive-index layer is formed in a film thickness of 100 nm; and the silicon nitride film 124 used as the high-refractive-index layer is formed in a film thickness of 50 nm, respectively.

In the R pixel 303, as in the second embodiment, in the order from the silicon substrate side, the silicon oxide film 114 used as the low-refractive-index layer is formed in a film thickness of 25 nm, and the silicon nitride film 122 used as the high-refractive-index layer is formed in a film thickness of 40 nm. On top thereof the silicon oxide film 125 used as the low-refractive-index layer is formed in a film thickness of 90 nm. The silicon nitride film 126 used as the high-refractive-index layer is formed in a film thickness of 120 nm.

In the B pixel 501, similarly, in the order from the silicon substrate side, the silicon oxide film 114 used as the low-refractive-index layer has a film thickness of 25 nm, and the silicon nitride film 122 used as the high-refractive-index layer has a film thickness of 40 nm. From here, unlike the first and second embodiments, on top thereof the silicon oxide film 127 used as the low-refractive-index layer is formed in a film thickness of 60 nm, and the silicon nitride film 128 used as the high-refractive-index layer is formed in a film thickness of 50 nm, respectively.

These anti-reflection films are shown magnified in FIG. 8(c). In the G pixel, as in the first embodiment, the silicon oxide film 114 forming the low-refractive-index layer, the silicon nitride film 122 forming the high-refractive-index layer, the silicon oxide film 123 forming the low-refractive-index layer, and the silicon nitride film 124 forming the high-refractive-index layer are laminated in this order as having a double layer of silicon oxide films and a double layer of silicon nitride films, respectively. In the R pixel, as in the second embodiment, the silicon oxide film 114 forming the low-refractive-index layer, the silicon nitride film 122 forming the high-refractive-index layer, the silicon oxide film 125 forming the low-refractive-index layer, and the silicon nitride film 126 forming the high-refractive-index layer are formed in this order as having a double layer of silicon oxide films and a double layer of silicon nitride films, respectively. In the B pixel, the silicon oxide film 114 forming the low-refractive-index layer, the silicon nitride film 122 forming the high-refractive-index layer, the silicon oxide film 127 forming the low-refractive-index layer, and the silicon nitride film 128 forming the high-refractive-index layer are formed in this order as having a double layer of silicon oxide films and a double layer of silicon nitride films, respectively.

On top of the above-described anti-reflection films of the B pixel 501, R pixel 303, and G pixel 102, the interlayer insulation films 113, 111 and 110, the protection film 108, the color filter 106, the planarizing films 107 and 105, and the microlens 104 are formed in the pixel of each color, respectively. The manufacturing method thereof will be described in detail later.

Figure 6:
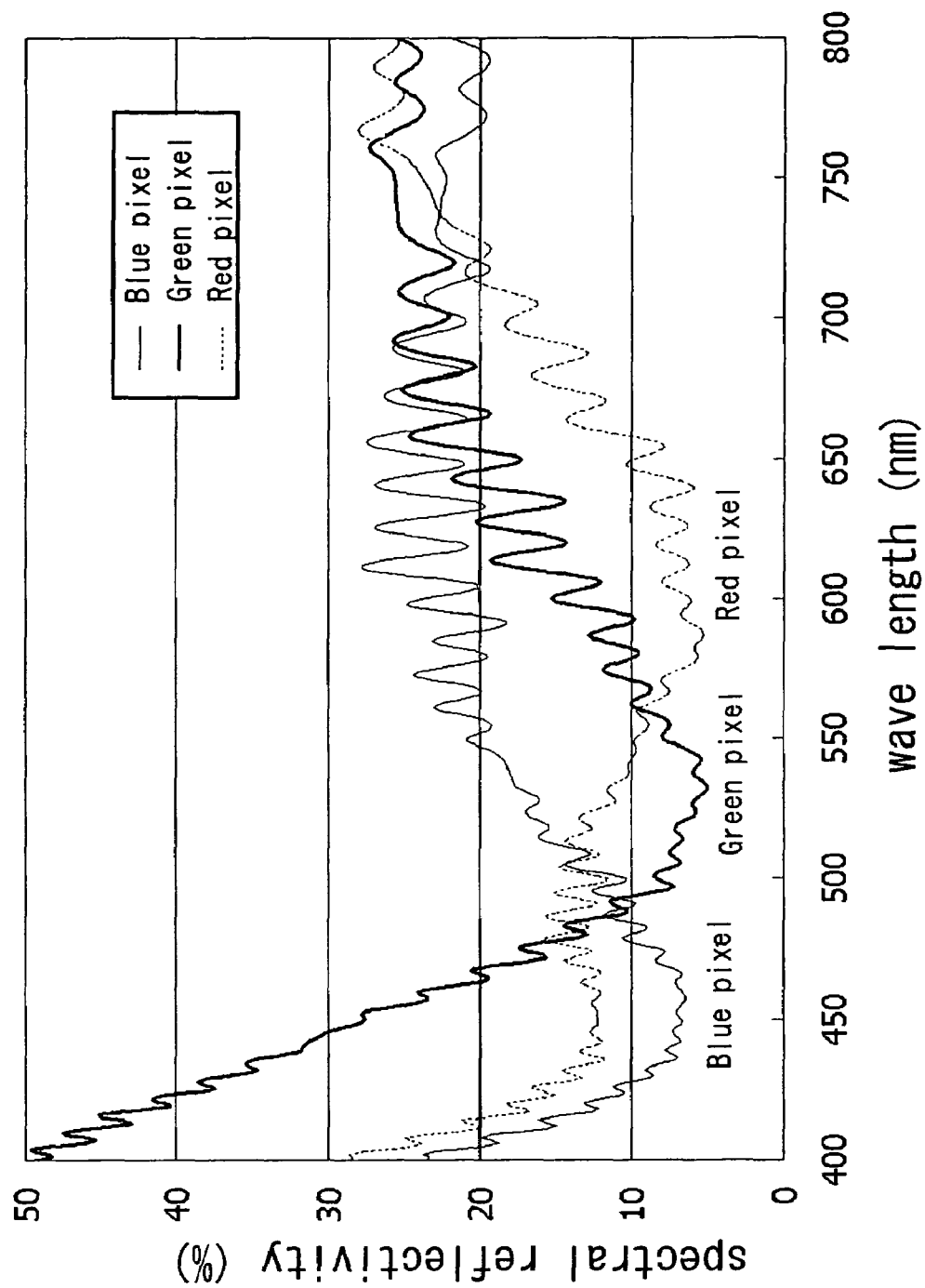
FIG. 6 is a plot of the spectral reflectivity of the third embodiment.

Next, the optical characteristic of the solid-state image sensor in the third embodiment is described with reference to FIG. 6. FIG. 6 shows, as in FIG. 2 and FIG. 4, a plot of the spectral reflectivity characteristic where the horizontal axis represents wavelength and the vertical axis represents reflectivity. In the third embodiment, in addition to the decreases in the spectral reflectivities for green light of the G pixel and red light of the R pixel as in the second embodiment, the spectral reflectivity for blue light of the B pixel can be also reduced. For the spectral reflectivity of blue light, the reflectivity at the wavelength of 450 nm can be reduced down to 6.4% in FIG. 6 of the third embodiment, while in FIG. 4 of the second embodiment it was about 18.9%. The variation in reflectivity generated in the B pixel due to the manufacturing variation of each film thickness can be reduced down to 7.4% as shown below in the third embodiment, while in the first embodiment it was 16.1%:

B pixel (450 nm): 6.4+7.4%;
G pixel (530 nm): 5.3+8.0%; and
R pixel (600 nm): 6.1+8.4%.

Note that the above represents reflectivity+variation at each wavelength determined by calculation, as in the first and second embodiments.

In this way, the reflectivity for blue light of the B pixel can be also reduced in the third embodiment, so that the sensitivity of the solid-state image sensor for blue light can be increased. The variation in reflectivity of blue light generated due to the manufacturing variation can be also reduced as compared with the first and second embodiments. Thus, with the solid-state image sensor of the third embodiment, it is possible to provide a solid-state image sensor having small reflection loss at all the wavelengths of RGB and high sensitivity at all the wavelengths as compared with the conventional anti-reflection structure having a single layer of high-refractive-index layer. The variation in reflectivity can be also significantly reduced across the whole wavelength region of RGB as compared with a single layer of high-refractive-index layer.

FIGS. 9(a) to 9(c) show the calculation results of the best values of the thicknesses of the second layer silicon oxide film and the second layer silicon nitride film in the case where the 25 nm film thickness of the first layer silicon oxide film of the undermost layer described in the embodiments of the present invention and the 40 nm film thickness of the first layer silicon nitride film thereabove are set to the same thicknesses, respectively, in all the RGB pixels. FIG. 9(a) shows the calculation result of the best value for the B pixel, FIG. 9(b) shows the calculation result of the best value for the G pixel, and FIG. 9(c) shows the calculation result of the best value for the R pixel, respectively, in which the row direction the film thicknesses of the silicon oxide film forming the low-refractive-index layer of the second layer are given in the unit of nm, and in the column direction the film thicknesses of the silicon nitride film forming the high-refractive-index layer of the second layer are given in the unit of nm with the resolution of 10 nm, respectively, and where the reflectivities (%) are expressed to one decimal point. Accordingly, there may be a best value between the values with the resolution of 10 nm given in FIGS. 9(a) to 9(c).

For example, for the best value of the B pixel, a combination of a 60 nm film thickness of the silicon oxide film and a 50 nm film thickness of the silicon nitride film where the spectral reflectivity is the minimum of 6.4% is the best value. For the best value of the G pixel, a combination of a 100 nm film thickness of the silicon oxide film and a 50 nm film thickness of the silicon nitride film where the spectral reflectivity is the minimum of 5.3% is the best value. Similarly, for the best value of the R pixel, a combination of a 90 nm film thickness of the silicon oxide film and a 120 nm film thickness of the silicon nitride film where the spectral reflectivity is the minimum of 6.1% is the best value. Since it can be seen from FIG. 9 that the reflectivity will not degrade too much even if there is a deviation of about 10 nm from the best film thickness, the accuracy control during production is easy and the yield improvement can be achieved, thus leading to cost reduction.

Fourth Embodiment

Although the first to third embodiments relate to solid-state image sensors, the techniques disclosed herein are also effective in display devices utilizing RGB lights. In the fourth embodiment, a case where the above-described anti-reflection structure is applied to a display device is described with reference to FIGS. 10(a) and 10(b). FIG. 10(a) is a plan view of a display device 651 constituting a liquid crystal display device, an EL (Electroluminescent Display) device, or the like, where each display pixel of a B pixel 652 emitting blue light, a G pixel 653 emitting green light, and an R pixel 654 emitting red light is arranged repeatedly in stripes. Although not illustrated, a luminescence part corresponding to a pixel of each color is provided on the back, so that a color image can be displayed by changing the brightness of the luminescence part of each color. FIG. 10(b) is a cross section when cut at a section position D of FIG. 10(a), where the same anti-reflection layer as the one described in the third embodiment is provided on a transparent substrate 655, and on top thereof a transparent resin 656 combining a planarizing layer and a protection film is formed. Although not illustrated, under the transparent substrate 655, a liquid crystal display part or an EL element is formed, and for example, when integrally formed with the EL element in the forming process of the EL element, the top surface of the EL element may come out in place of the transparent substrate 655.

Figure 10:
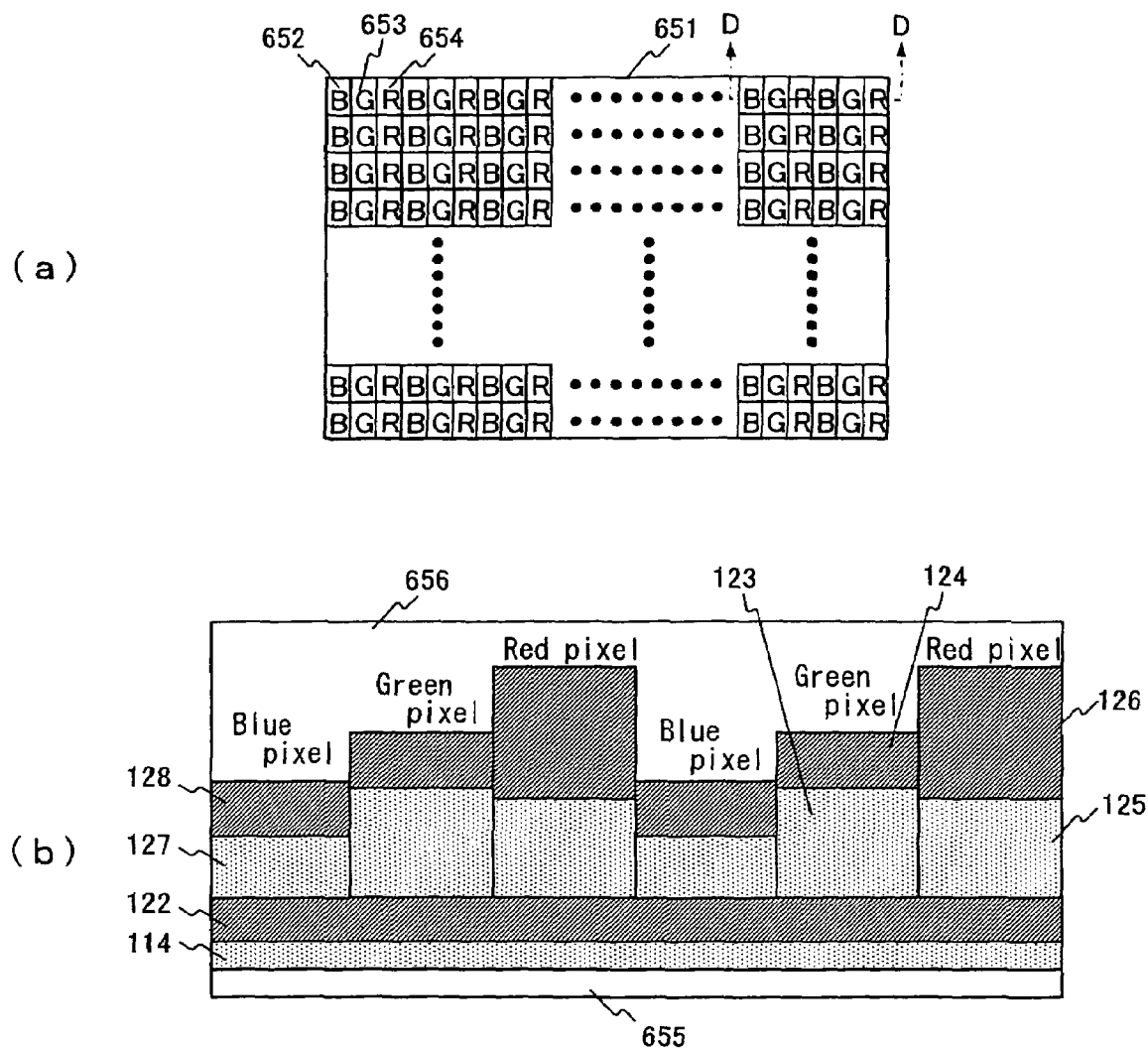
FIGS. 10(a) and 10(b) show a plan view and cross-section, respectively, illustrating a fourth embodiment.

In anti-reflection layers constituting the B pixel, G pixel, and R pixel of FIG. 10(*b*), the silicon oxide film 114 constituting the low-refractive-index layer of the first layer is formed on the transparent substrate 655, as the one shown in the third embodiment, and on top thereof the silicon nitride film 122 constituting the high-refractive-index layer of the first layer is formed. These first layers are common for the respective color pixels of RGB, so they can be formed in the same manufacturing process. On top of the silicon nitride film 122 of the first layer, a silicon oxide film constituting the low-refractive-index layer of the second layer is formed in a thickness of the silicon oxide film 127 for the B pixel, in a thickness of the silicon oxide film 123 for the G pixel, and in a thickness of the silicon oxide film 125 for the R pixel, respectively. On top thereof, the silicon nitride film constituting the high-refractive-index layer of the second layer is formed in a thickness of the silicon nitride film 128 for the B pixel, in a thickness of the silicon nitride film 124 for the G pixel, and in a thickness of the silicon nitride film 126 for the R pixel, respectively.

Unlike the cases of the silicon substrate in other embodiments, by optimizing these thicknesses to the film thickness of the anti-reflection layer suitable for the transparent substrate 655, a bright display device can be achieved without losing the brightness of the luminescence part present under the transparent substrate 655. Moreover, as in the solid-state image sensor, some display devices may be provided with a microlens, and in this case the microlens may be formed on top of the transparent resin 656 or may be integrally formed with the transparent resin 656. In the fourth embodiment described above, the same double layer structure for each color of the RGB as that in the third embodiment is used, but the same structure as that of the first embodiment or the second embodiment may be used.

Manufacturing Method

Figure 11:
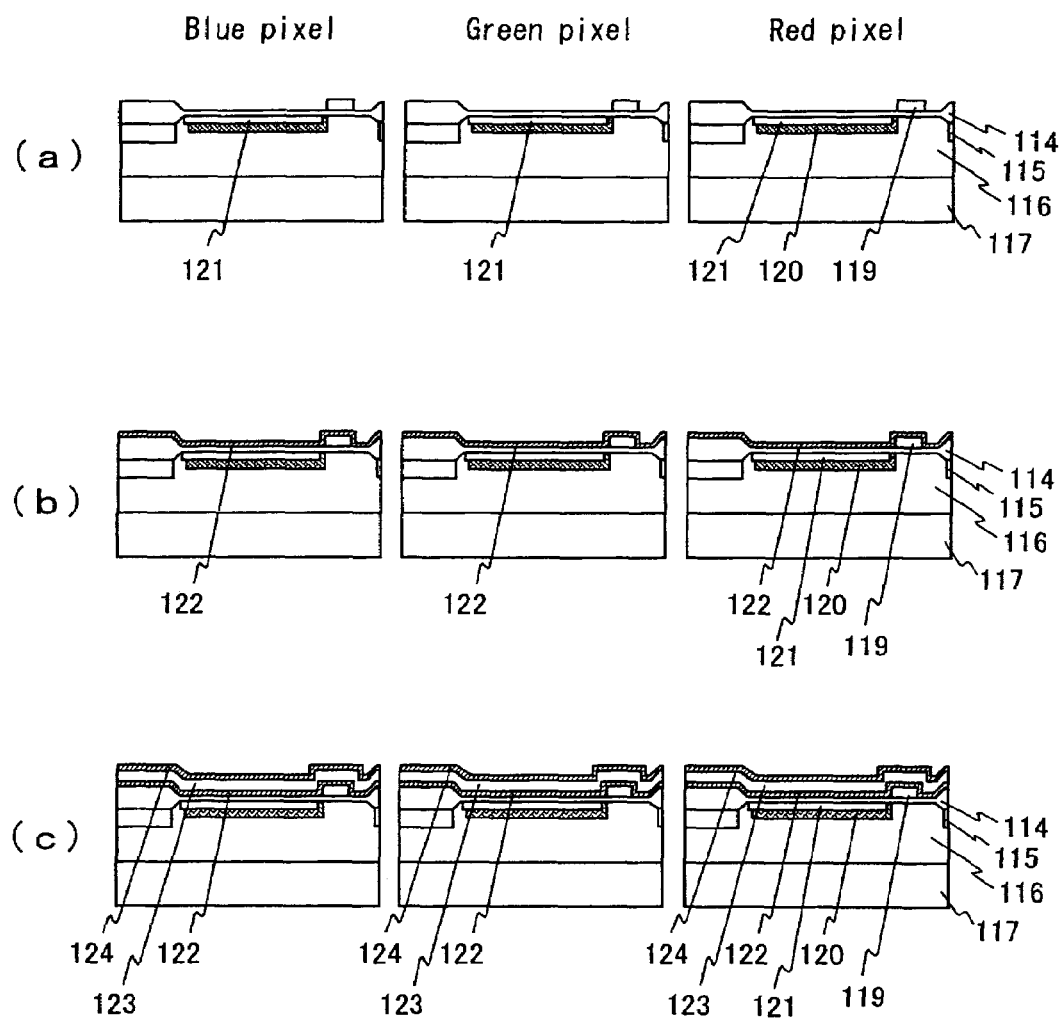
FIGS. 11(a) to 11(c) show cross sections of B, G, and R pixels, illustrating respective steps of a manufacturing method of the first embodiment.
Figure 12:
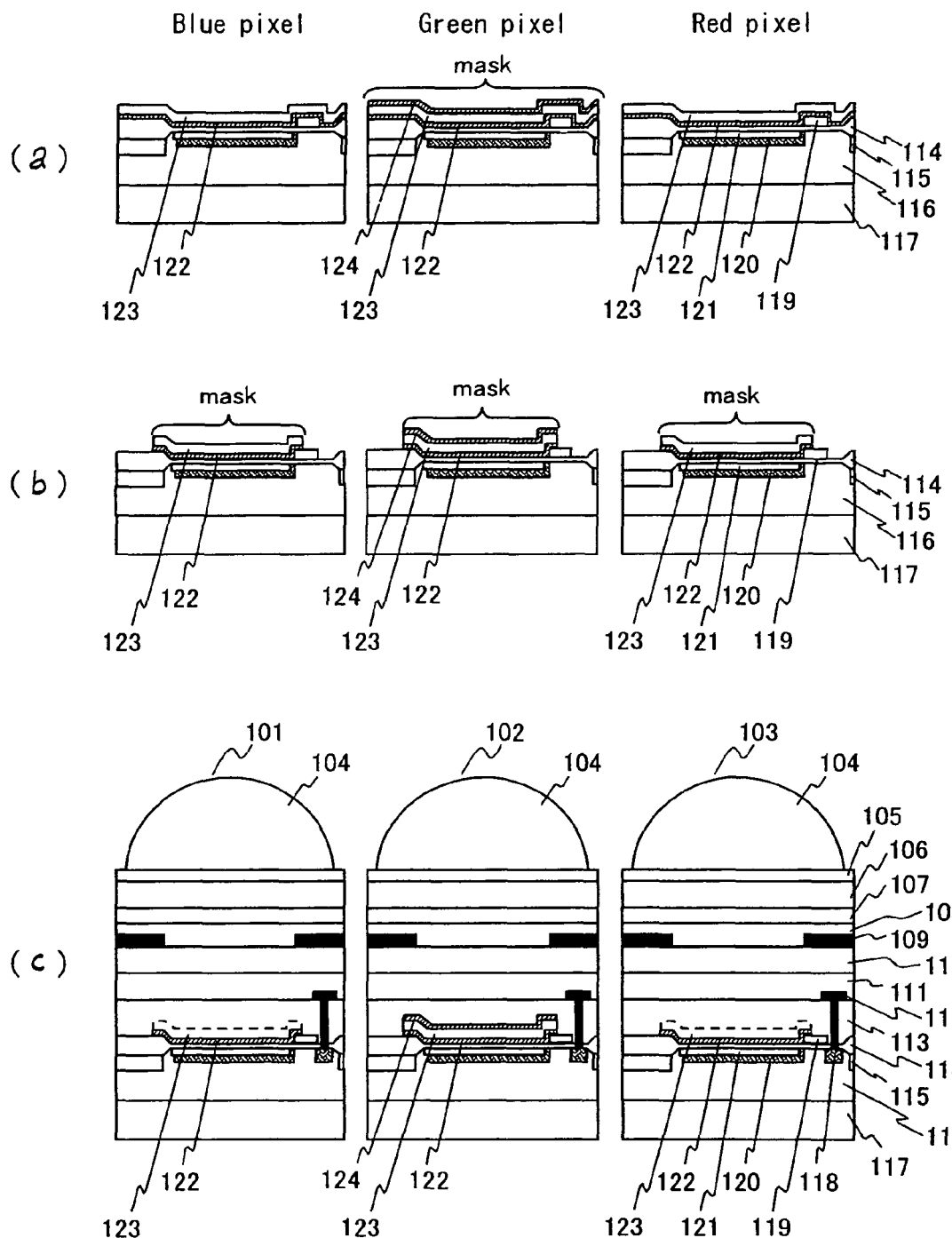
FIGS. 12(a) to 12(c) show cross sections of B, G, and R pixels, illustrating respective steps of the manufacturing method of the first embodiment.

Next, a method for manufacturing the CMOS type solid-state image sensor described in the first embodiment is described with reference to FIGS. 11(*a*) to 11(*c*) and FIGS. 12(*a*) to 12(*c*). Since the manufacturing method up to the process of forming the protection layer of surface depletion 121, in which a photodiode is formed, in FIG. 1 is the same as the regular method for manufacturing a solid-state image sensor, the description thereof is omitted, and thus from a state of FIG. 11(*a*), where the silicon oxide film 114 is formed as the low-refractive-index layer in a film thickness of 25 nm in the photodiode portion using CVD (Chemical Vapor Deposition), the steps of the manufacturing method are described.

Step 1

On top of the silicon oxide film 114 of a 25 nm film thickness, the silicon nitride films 122 formed by LPCVD (Low Pressure CVD) is formed in a film thickness of 40 nm as the high-refractive-index layer. The result of this step is shown in FIG. 11(*b*).

Step 2

The silicon oxide film 123 formed of a CVD film is formed in a film thickness of 100 nm as the low-refractive-index layer. Furthermore, the silicon nitride film 124 formed by LPCVD is formed in a film thickness of 50 nm as the high-refractive-index layer. The result of this step is shown in FIG. 11(*c*).

Step 3

With only the G pixel being masked, the silicon nitride film 124 in the R pixel and B pixel is removed using conventional photolithography and etching. The result of this step is shown in FIG. 12(*a*). Note that such treatment also thins the silicon oxide film 123 present directly under the silicon nitride film 124 by about 5 nm due to over etching, however, the silicon oxide film 123 thinned by etching will not affect the anti-reflection characteristic.

Step 4

Each of the BGR pixels is masked so as to cover at least the optical receiving part portion, and the silicon oxide film 123 and silicon nitride films 124 and 122 in an unmasked portion are removed by the photolithography and etching. The result of this step is shown in FIG. 12(*b*).

Step 5

Using conventional manufacturing methods for making solid-state image sensors, an interlayer insulation film, a protection film, a color filter, a planarizing film, a microlens, and the like are formed to complete the elements of the CMOS type solid-state image sensor. The result of this step is shown in FIG. 12(*c*).

In this way, an anti-reflection film including a double layer of high-refractive-index layers consisting of the silicon nitride films 122 and 124 can be formed only in the G pixel 102, while in the R pixel 103 and B pixel 101, an anti-reflection film including a single layer of high-refractive-index layer of the silicon nitride film 122 can be formed. According to this manufacturing method, the silicon oxide film 123, which was thinned by about 5 nm in the B pixel and R pixel in Step 3, is integrated with the interlayer insulation film 113 in the subsequent process, so the thinned silicon oxide film 123 will not affect the characteristic of the anti-reflection film.

Figure 13:
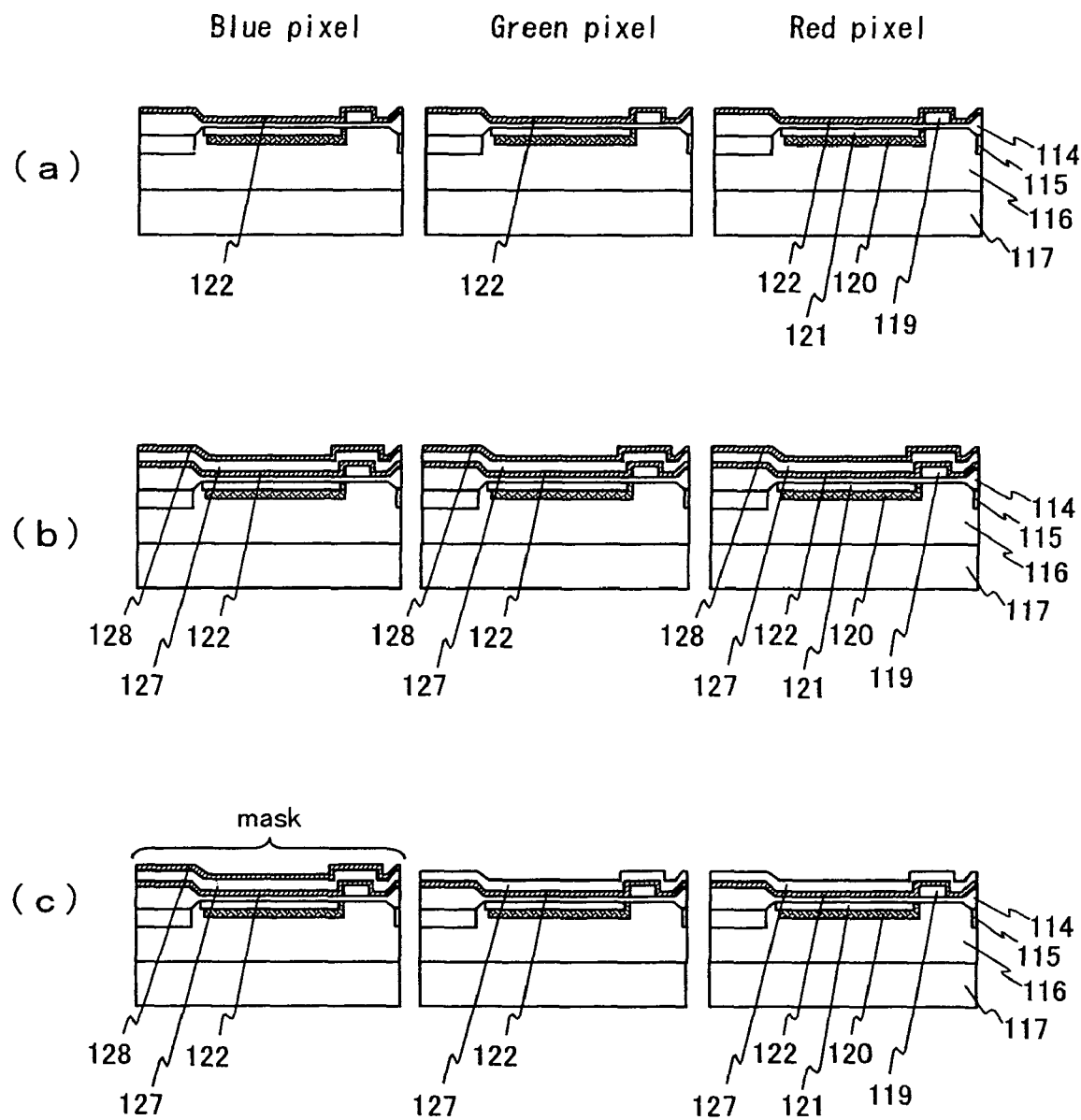
FIGS. 13(a) to 13(c) show cross sections of B, G, and R pixels, illustrating respective steps of a manufacturing method of the third embodiment.
Figure 14:
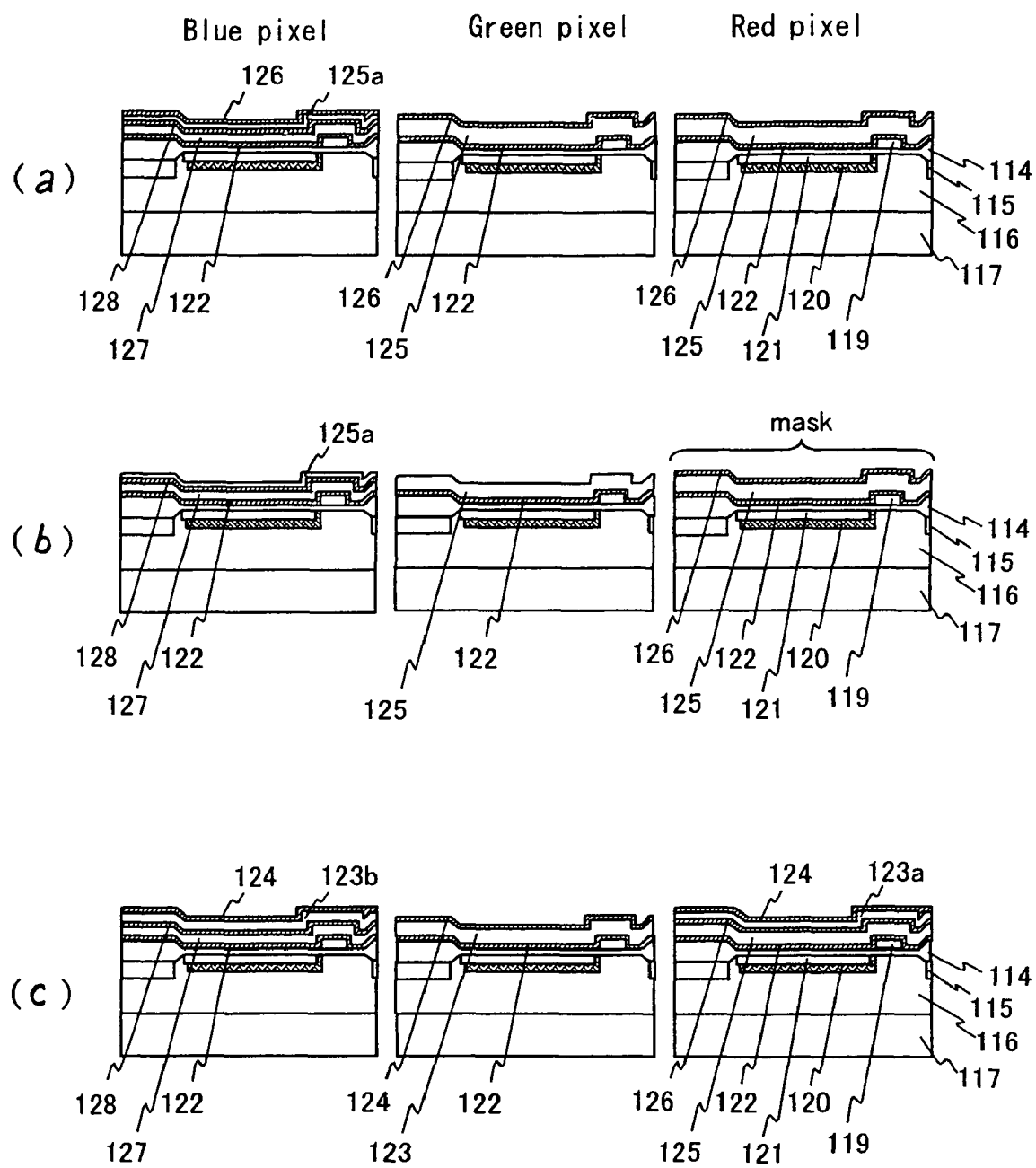
FIGS. 14(a) to 14(c) show cross sections of B, G, and R pixels, illustrating respective steps of the manufacturing method of the third embodiment.
Figure 15:
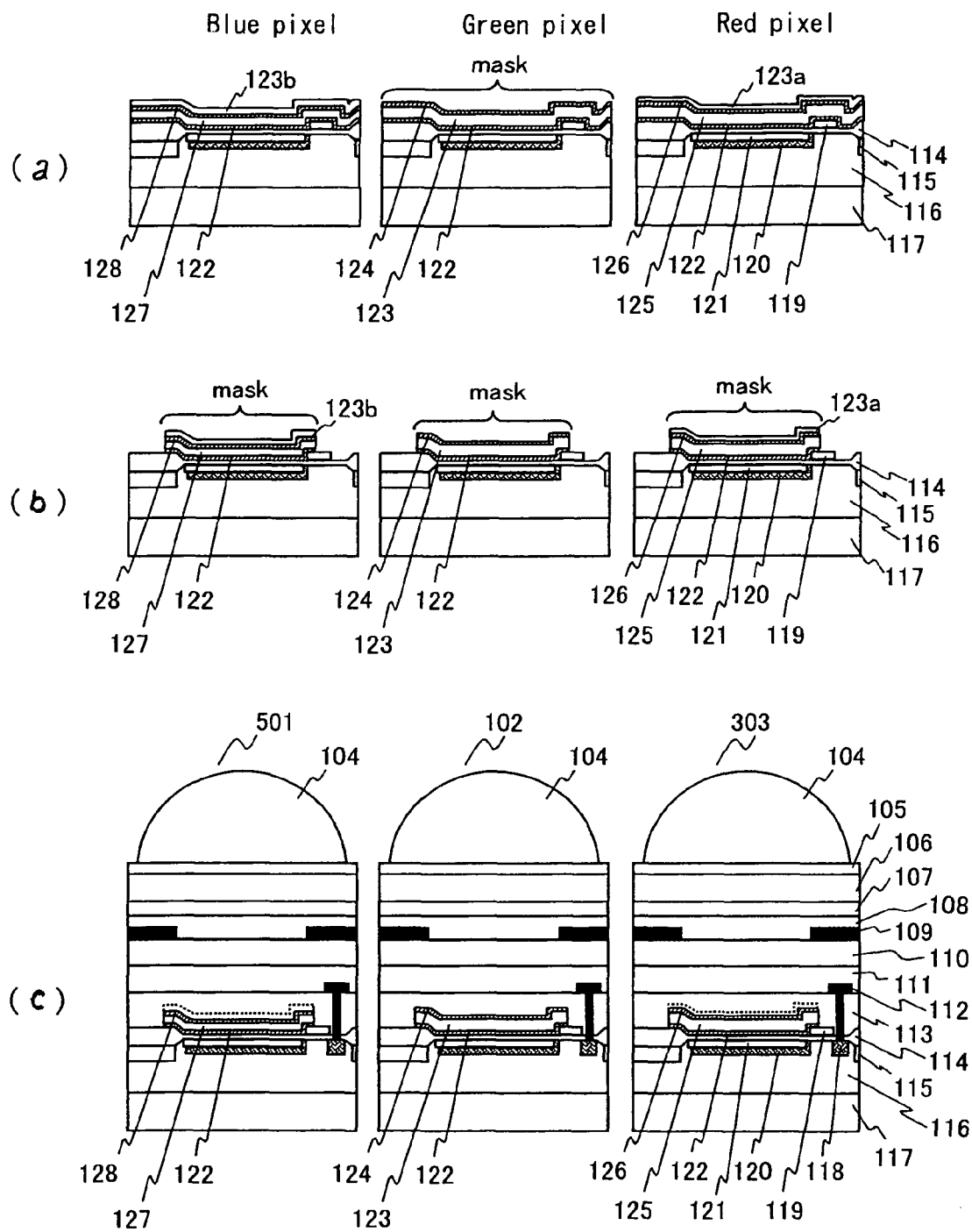
FIGS. 15(a) to 15(c) show cross sections of B, G, and R pixels, illustrating respective steps of the manufacturing method of the third embodiment.

A manufacturing method for the third embodiment will be described in detail with reference to FIGS. 13(*a*) to 13(*c*), FIGS. 14(*a*) to 14(*c*), and FIGS. 15(*a*) to 15(*c*). As in the description of the manufacturing method of the first embodiment, since the manufacturing method up to the process of forming the protection layer of surface depletion 121, in which a photodiode is formed, is the same as the regular method for manufacturing a solid-state image sensor, the description thereof is omitted. Thus, from a state of FIG. 13(*a*), where the silicon oxide film 114 is formed as the low-refractive-index layer in a film thickness of 25 nm in the photodiode portion using CVD, the steps of the manufacturing method are described.

Step 10

On top of the silicon oxide film 114 of a 25 nm film thickness, the silicon nitride film 122 formed by LPCVD is formed in a film thickness of 40 nm as the high-refractive-index layer. The result of this step is shown in FIG. 13(*a*).

Step 11

The silicon oxide film 127 formed of a CVD film is formed in a film thickness of 60 nm as the low-refractive-index layer. Furthermore, the silicon nitride film 128 formed by LPCVD is formed in a film thickness of 50 nm as the high-refractive-index layer. The result of this step is shown in FIG. 13(*b*).

Step 12

With the B pixel being masked, the silicon nitride film 128 in the upper layers of the G pixel and R pixel is removed using the photolithography and etching. At this time, the silicon oxide film 127 present directly under the silicon nitride film 128 of the G pixel and R pixel is also thinned by about 10 nm due to over etching. The result of this step is shown in FIG. 13(*c*).

Step 13

A silicon oxide film 125*a* is formed in a film thickness of 40 nm and the silicon nitride film 126 is formed in a film thickness of 120 nm. At this time, in the G pixel and R pixel, the silicon oxide film 127 remaining in Step 12 and the silicon oxide film 125*a* formed in Step 13 integrally form the silicon oxide film 125. The result of this step is shown in FIG. 13(*a*).

Step 14

With the R pixel being masked, the silicon nitride film 126 in the upper layers of the B pixel and G pixel is removed by the photolithography and etching. With this process, the silicon oxide films 125 and 125*a* present directly under the silicon nitride film 126 of the B pixel and G pixel are thinned by about 20 nm. The result of this step is shown in FIG. 13(*b*).

Step 15

A silicon oxide film 123*a* is formed in a film thickness of 30 nm and the silicon nitride film 124 is formed in a film thickness of 50 nm. At this time, in the B pixel and G pixel, the silicon oxide films 125 and 125*a* remaining in Step 14 and the silicon oxide film 123*a* formed in Step 15 integrally form the silicon oxide films 123 and 123*b*. The result of this step is shown in FIG. 13(*c*).

Step 16

With the G pixel being masked, the silicon nitride film 124 in the upper layers of the B pixel and R pixel is removed by the photolithography and etching. With this treatment, the silicon oxide films 123*b* and 123*a* present directly under the silicon nitride film 124 of the B pixel and R pixel are thinned by about 5 nm. The result of this step is shown in FIG. 15(*a*).

Step 17

With the optical receiving part portion of each of the BGR pixels being masked, the silicon oxide films 123*a*, 123*b*, 125, and 127 and silicon nitride films 124, 126, 128, and 122 in an unmasked portion are removed by the photolithography and etching. The result of this step is shown in FIG. 15(*b*).

Step 18

With the same method for manufacturing a solid-state image sensor as that of the prior art, an interlayer insulation film, a protection film, a color filter, a planarizing film, a microlens, and the like are formed to complete the elements of the CMOS type solid-state image sensor. The solid-state image sensor after completion is shown in FIG. 15(*c*).

Thus, in the G pixel 102, an anti-reflection film including a double layer of high-refractive-index layers consisting of the silicon nitride films 122 and 124 and the silicon oxide films 114 and 123 is formed. In the R pixel 303, an anti-reflection film including a double layer of high-refractive-index layers consisting of the silicon nitride films 122 and 126 and the silicon oxide films 114 and 125 is formed. In the B pixel 501, an anti-reflection film including a double layer of high-refractive-index layers consisting of the silicon nitride films 122 and 128 and the silicon oxide films 114 and 127 is formed. It is thus possible to manufacture a solid-state image sensor having optimized anti-reflection films whose film thickness differ for each of the BGR pixels as described above.

According to this manufacturing method, the silicon oxide film 127, which was thinned by about 10 nm in the G pixel and R pixel in Step 12, is integrated with the silicon oxide film 125*a* in the subsequent process, so that the thinned silicon oxide film 127 will not affect the characteristic of the anti-reflection film. Similarly, the silicon oxide films 125 and 125*a* in the B pixel and G pixel are also thinned by about 20 nm in Step 14 but are integrated with the silicon oxide film 123*a* in the subsequent step. The silicon oxide films 123*b* and 123*a* in the B pixel and R pixel are also thinned by about 5 nm in Step 16 but are integrated with the silicon oxide film 113 in the subsequent step, so that the thinned silicon oxide films 125, 125*a*, 123*b*, and 123*a* will not affect the characteristic of the anti-reflection film.

The film thickness of the silicon oxide film in the undermost layer and the film thickness of the silicon nitride film thereabove are set to the same thickness, respectively, so that in all the RGB pixels in the present embodiments, a common treatment can be used in all the pixels and thus the manufacturing method can be simplified. Even if the thicknesses are not set to the same ones in all the RGB pixels, the reflectivity of each pixel and the manufacturing variation can be adjusted, and even when the thicknesses differ from each other the effect of the present invention will not change, so that these thicknesses are not limited to the present embodiments.

As described above, according to the solid-state image sensors of the present invention, since the anti-reflection films above the R pixel, B pixel, and G pixel are optimized, it is possible to provide a solid-state image sensor having small reflection loss at all the wavelengths of RGB and high sensitivity at all the wavelengths as compared with the conventional anti-reflection film having a single layer of high-refractive-index layer. Furthermore, the subject solid-state image sensors can be made with high production yield, in which the variation in reflectivity due to the variation in the film thickness during manufacturing is also significantly reduced in all the wavelength regions of RGB as compared with a single high-refractive-index layer.

In various embodiments the high-refractive-index layer is formed of a silicon nitride film. But this is not intended to be limiting. Materials having a refractive index of 1.7 or higher, for example, an oxide of titanium or the like, may alternatively be used. Similarly, although the low-refractive-index layer also has been formed of a silicon oxide film, any material having a refractive index of less than 1.7 has the same effect as that of the present embodiments.

The many features and advantages of the embodiments are apparent from the detailed specification. Thus, it is intended that the appended claims cover all such features and advantages of the embodiments that fall within the true spirit and scope thereof. Further, since numerous modifications and changes will readily occur to those skilled in the art, it is not desired to limit the inventive embodiments to the exact construction and operation illustrated and described herein, and accordingly all suitable modifications and equivalents may be resorted to, falling within the scope thereof.

The invention claimed is:

1. A solid-state image sensor, comprising:
   an optical unit separating incident light into a plurality of color elements;
   an optical receiving unit comprising multiple pixels which convert respective color elements separated by said optical unit to corresponding electrical signals; and
   an anti-reflection film including a high-refractive-index layer having a refractive index of 1.7 or higher and a low-refractive-index layer having a refractive index of less than 1.7, the anti-reflection film being provided between the optical unit and said optical receiving unit for each of the pixels, wherein
   with respect to at least a first color element of the plurality of color elements, the anti-reflection film of the respective pixel comprises a quantity of at least two separate high-refractive-index layers and a quantity of at least two separate low-refractive-index layers; and with respect to a second color element of the plurality of color elements, the anti-reflection film of the respective pixel comprises a quantity of separate high-refractive-index layers and a quantity of separate low-refractive-index layers that are different from the respective quantities of high-refractive-index layers and low-refractive-index layers of the anti-reflection film of the pixel for the first color element.

2. The solid-state image sensor according to claim 1, wherein, with respect to at least one pixel for at least one color element, one of film thickness and film material in each high-refractive-index layer and each low-refractive-index layer differs corresponding to the particular corresponding color element.

3. The solid-state image sensor according to claim 2, wherein, among pixels having two or more separate high-refractive-index layers, film material and film thickness of the layer nearest to said optical receiving unit are the same.

4. The solid-state image sensor according to claim 2, wherein, among the pixels for each of the color elements, the film material and film thickness of the low-refractive-index layer arranged nearest to the optical receiving unit are the same.

5. The solid-state image sensor according to claim 2, wherein:

the color elements include a first color element, a second color element, and a third color element; and the third color element differs from the first and second color elements, and the anti-reflection film of pixels of the third color element includes a single high-refractive-index layer and one or more low-refractive-index layers.

6. The solid-state image sensor according to claim 1, wherein among pixels having two or more separate high-refractive-index layers, film material and film thickness of the high-refractive-index layer nearest to the optical receiving unit are the same.

7. The solid-state image sensor according to claim 6, wherein, among the pixels for each of the color elements, the film material and film thickness of the low-refractive-index layer arranged nearest to the optical receiving unit are the same.

8. The solid-state image sensor according to claim 6, wherein:

the color elements include a first color element, a second color element, and a third color element; and the third color element differs from the first and second color elements, and the anti-reflection film of pixels of the third color element includes a single high-refractive-index layer and one or more low-refractive-index layers.

9. The solid-state image sensor according to claim 1, wherein, among the pixels for each of the color elements, the film material and film thickness of the low-refractive-index layer arranged nearest to the optical receiving unit are the same.

10. The solid-state image sensor according to claim 9, wherein:

the color elements include a first color element, a second color element, and a third color element; and the third color element differs from the first and second color elements, and the anti-reflection film of pixels of the third color element includes a single high-refractive-index layer and one or more low-refractive-index layers.

11. The solid-state image sensor according to claim 1, wherein:

the color elements include a first color element, a second color element, and a third color element; and the third color element differs from the first and second color elements, and the anti-reflection film of pixels of the third color element includes a single high-refractive-index layer and one or more low-refractive-index layers.

12. The solid-state image sensor according to claim 11, wherein said first color element is green light, said second color element is blue light, and said third color element is red light.

13. The solid-state image sensor according to claim 1, wherein, among pixels having two ore more separate high-refractive-index layers, film material and film thickness of the layer nearest to said optical receiving unit are the same.

14. The solid-state image sensor according to claim 1, wherein, among the pixels for the first color element and the pixels for the second color element, film thicknesses of the respective low-refractive-index layers closest to the optical receiving unit are the same.

15. The solid-state image sensor according to claim 1, wherein, among the pixels for the first color element and the pixels for the second color element, film thicknesses of the respective high-refractive-index layers closest to the optical receiving unit are the same.

* * * * *

UNITED STATES PATENT AND TRADEMARK OFFICE
CERTIFICATE OF CORRECTION

PATENT NO. : 7,829,908 B2
APPLICATION NO. : 12/084679
DATED : November 9, 2010
INVENTOR(S) : Tadashi Narui Page 1 of 1

It is certified that error appears in the above-identified patent and that said Letters Patent is hereby corrected as shown below:

In the Specification:

Column 3, lines 45-46, "low-refractive index-layers" should be --low-refractive-index layers--

Column 6, line 18, "portion, 721" should be --portion; 721--

Column 7, line 21, "R pixel" should be --G pixel--

Column 7, line 42, "includes a single layer" should be --include a single layer--

Column 7, line 61, "reflection loss becomes and" should be --the reflection loss, and--

Column 7, line 62, "sensitivity as the solid-state image sensor becomes." should be --sensitivity of the solid-state image sensor.--

Column 9, line 4, "for the and R pixel" should be --for the R pixel--

Column 10, line 32, "numeral 101" should be --numeral 501--

Column 10, line 34, "B pixel" should be --G pixel--

Column 10, line 35, "C pixel" should be --R pixel--

Column 10, line 36, "303 represents" should be --103 represents--

Column 12, line 21, "the row direction" should be --in the row direction--

Column 15, lines 62-63, "whose film thickness differ" should be --of which the film thicknesses differ--

Column 18, line 33, "two ore more" should be --two or more--

Signed and Sealed this
Eighth Day of May, 2012

David J. Kappos
*Director of the United States Patent and Trademark Office*